United States Patent
Nagai

(10) Patent No.: US 7,906,349 B2
(45) Date of Patent: Mar. 15, 2011

(54) METHOD FOR MANUFACTURING SEMICONDUCTOR DEVICE INCLUDING FERROELECTRIC CAPACITOR

(75) Inventor: Kouichi Nagai, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 254 days.

(21) Appl. No.: 12/263,770

(22) Filed: Nov. 3, 2008

(65) Prior Publication Data

US 2009/0117671 A1    May 7, 2009

(30) Foreign Application Priority Data

Nov. 5, 2007  (JP) ................. 2007-287737

(51) Int. Cl.
*H01L 21/00* (2006.01)

(52) U.S. Cl. .................. 438/14; 257/E21.529

(58) Field of Classification Search ............... 438/3, 14, 438/17, 18; 365/201; 257/E21.529, E21.53, 257/E21.531

See application file for complete search history.

(56) References Cited

U.S. PATENT DOCUMENTS

| 5,337,279 | A | * | 8/1994 | Gregory et al. | ........... 365/201 |
| 6,008,659 | A | * | 12/1999 | Traynor | ........... 324/658 |
| 7,203,108 | B2 | | 4/2007 | Noma | |

FOREIGN PATENT DOCUMENTS

| JP | 11-102600 A | 4/1999 |
| JP | 2002-025295 A | 1/2002 |
| JP | 2006-139866 A | 6/2006 |

* cited by examiner

*Primary Examiner* — Brook Kebede

(74) *Attorney, Agent, or Firm* — Westerman, Hattori, Daniels & Adrian, LLP

(57) ABSTRACT

A method for manufacturing a semiconductor device includes the step of conducting an acceptance/rejection judgment about the semiconductor device. The acceptance/rejection judgment is conducted by using a hysteresis loop that indicates the relationship between the applied voltage and the polarization quantity of the ferroelectric capacitor.

19 Claims, 33 Drawing Sheets

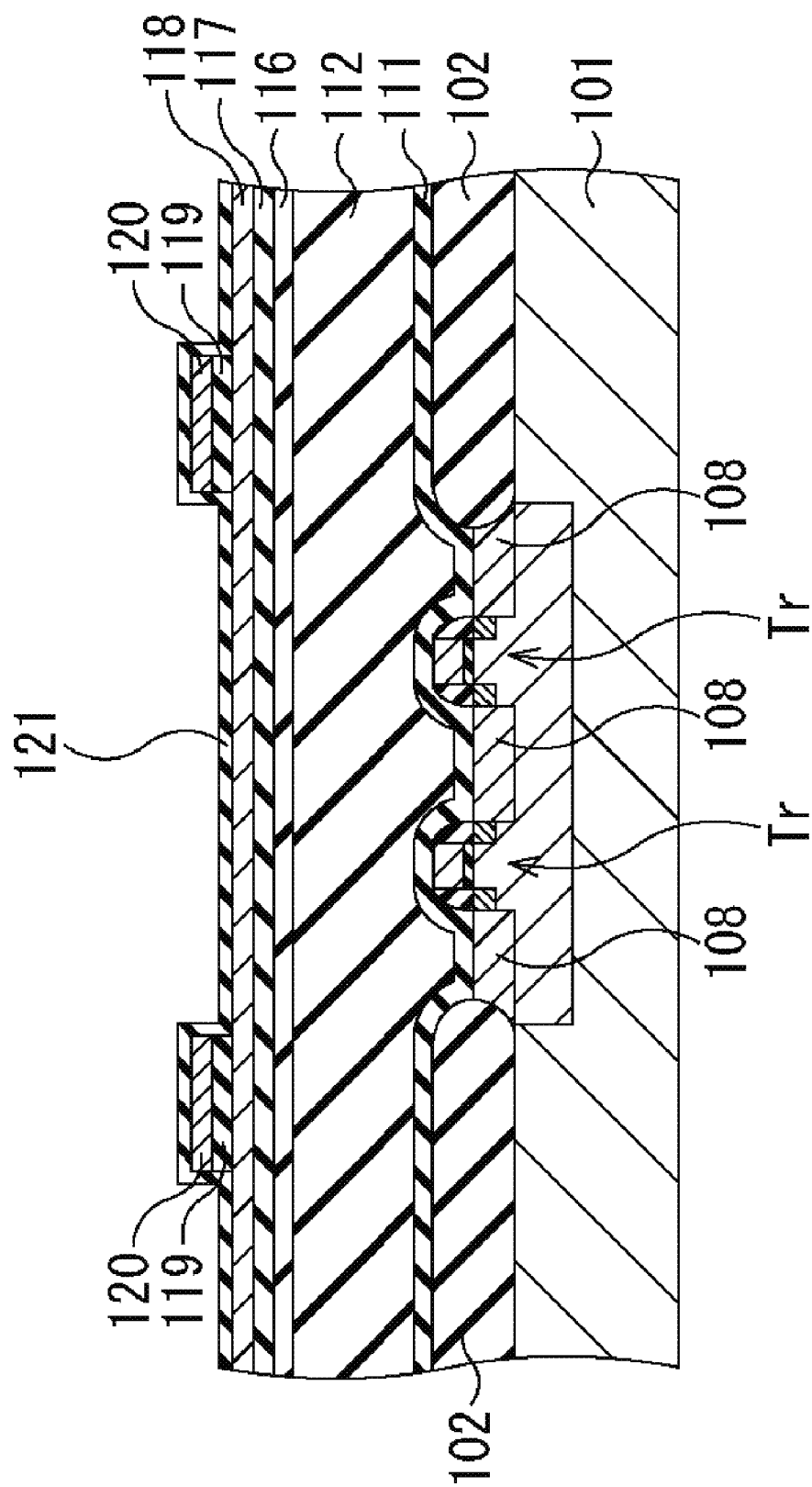

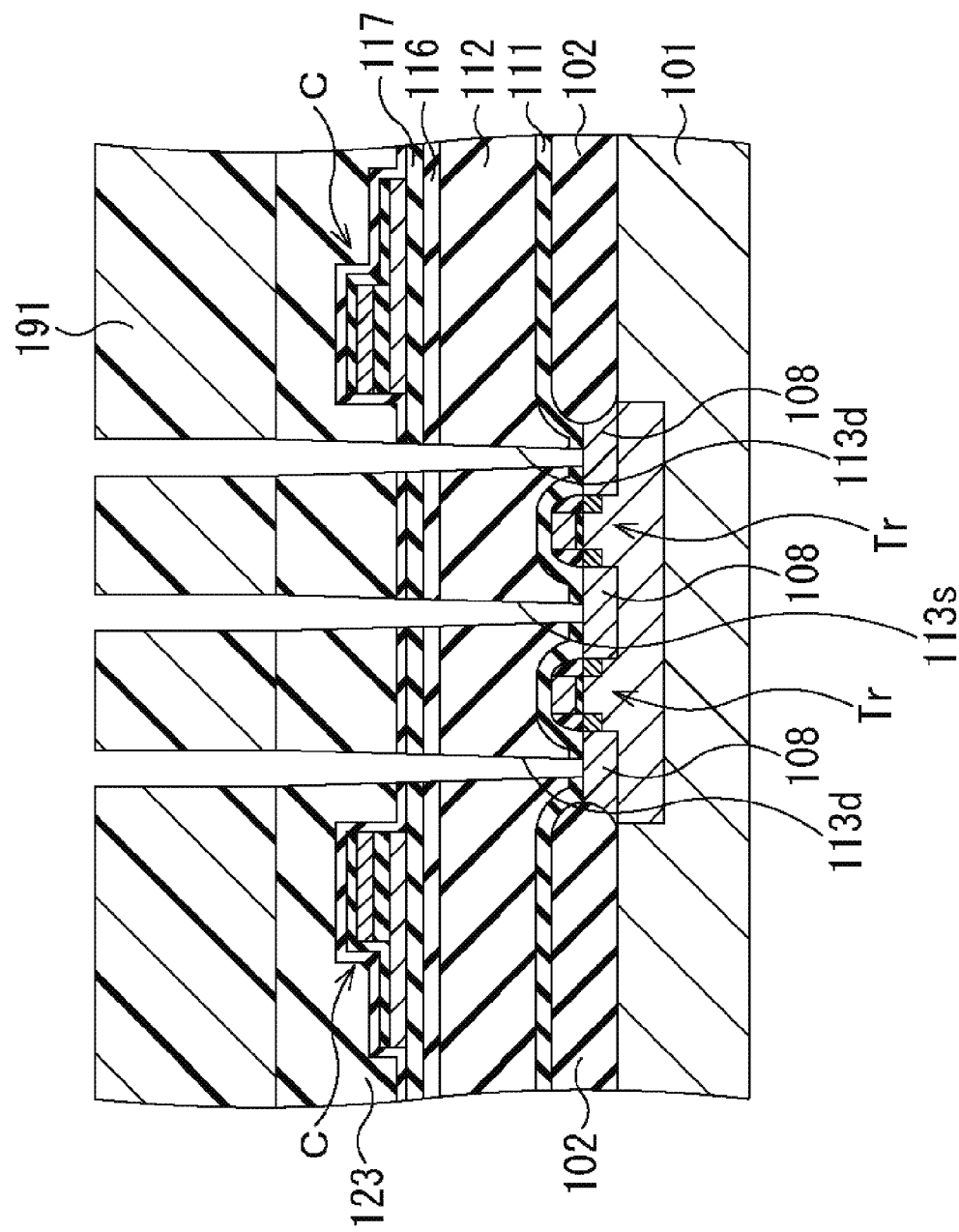

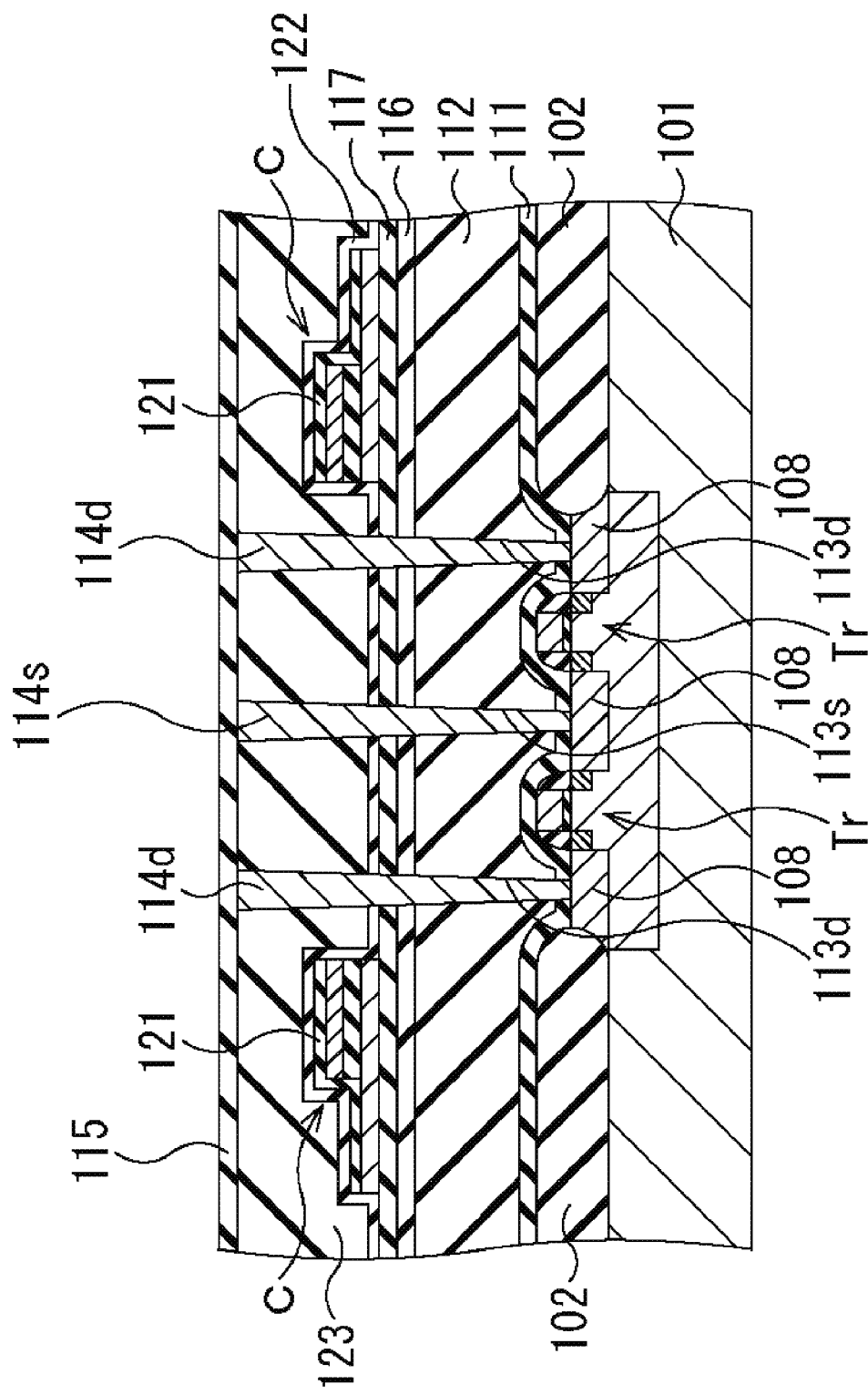

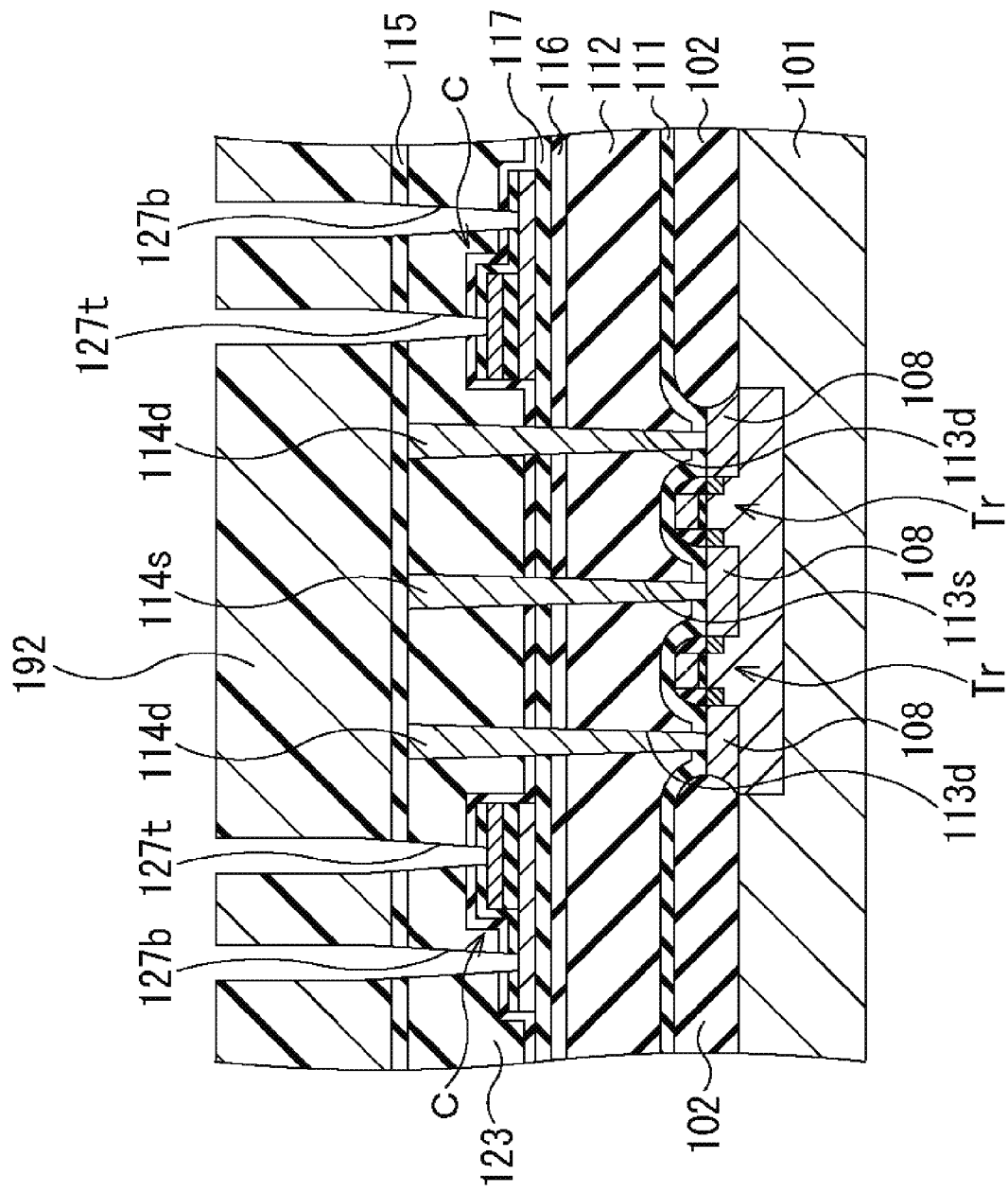

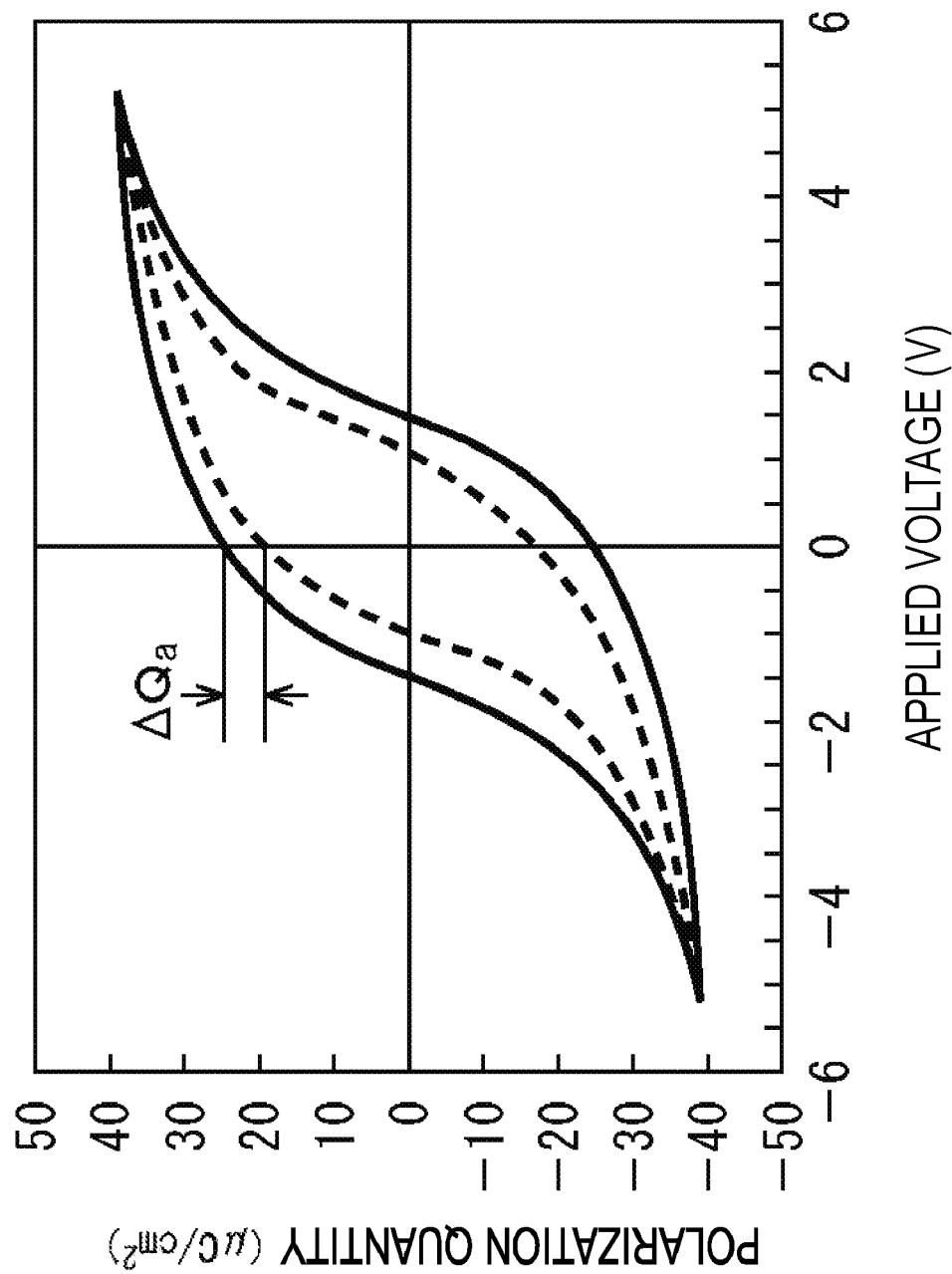

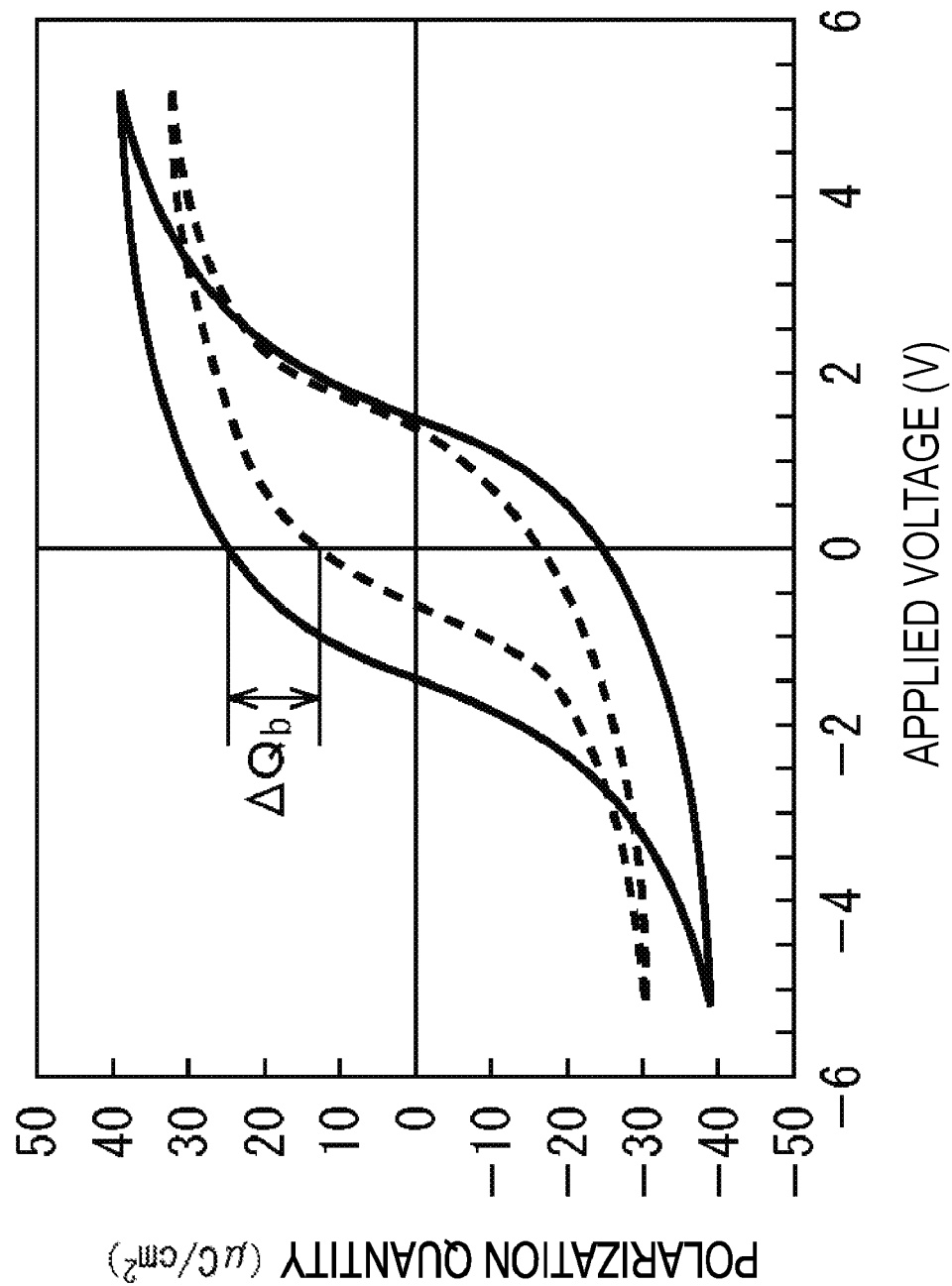

METHOD FOR MANUFACTURING SEMICONDUCTOR DEVICE INCLUDING FERROELECTRIC CAPACITOR

CROSS-REFERENCE TO RELATED APPLICATIONS

This application is based upon and claims the benefit of priority from the prior Japanese Patent Application No. 2007-287737, filed on Nov. 5, 2007 the entire contents of which are incorporated herein by reference.

BACKGROUND

1. Field

The present invention relates to a method for manufacturing a semiconductor device suitable for a ferroelectric memory.

2. Description of the Related Art

In recent years, a ferroelectric memory (FeRAM) that stores information in a ferroelectric capacitor by utilizing the polarization inversion of a ferroelectric has been developed. The ferroelectric memory is a nonvolatile memory wherein information does not disappear even when the power supply is shut off, and can realize high integration, high-speed driving, high durability, and low power consumption. As the materials for a ferroelectric film that composes the ferroelectric capacitor, ferroelectric oxides that have a perovskite crystal structure having a large residual polarization quantity, such as PZT ($Pb(Zr, Ti)O_3$) and SBT ($SrBi_2Ta_2O_9$) are mainly used. The residual polarization quantity of PZT is about 10 to 30 $\mu C/cm^2$.

In the same manner as in other semiconductor devices, ferroelectric memories are tested even after manufacturing.

Conventionally, an accelerated test has been conducted as the above-described test.

According to such a test, not only chips that do not correctly operate after manufacturing, but also chips that do not correctly operate thereafter in a short time can be eliminated.

However, the present inventors found that acceptable ferroelectric capacitors were damaged due to the above-described test, and their lives were shortened. The present inventors also found that when the relationship between the voltages applied to the ferroelectric film and polarization quantities was plotted on the graph, a highly symmetrical hysteresis loop was obtained; however, when the above-described test was conducted, the hysteresis loop was transited and symmetry was lost. Such a phenomenon may be called "imprint". If the hysteresis loop is transited even once, it does not return to the original position.

As described above, in the present test, a problem wherein effect to the characteristics of the ferroelectric capacitors cannot be suppressed has been caused.

SUMMARY

According to one aspect of the present invention, a method for manufacturing a semiconductor device includes the step of conducting acceptance/rejection judgment about the semiconductor device. The acceptance/rejection judgment is conducted by using a hysteresis loop that indicates the relationship between the applied voltage and the polarization quantity of the ferroelectric capacitor.

BRIEF DESCRIPTION OF THE DRAWINGS

FIGS. 1A to 1M are sectional views showing a method for manufacturing a ferroelectric memory;

FIG. 3A is a graph showing the lowering of the residual polarization quantity of a ferroelectric capacitor judged to be acceptable;

FIG. 3B is a graph showing the lowering of the residual polarization quantity of a ferroelectric capacitor judged to be defective;

DESCRIPTION OF THE PREFERRED EMBODIMENTS

Figure 15:
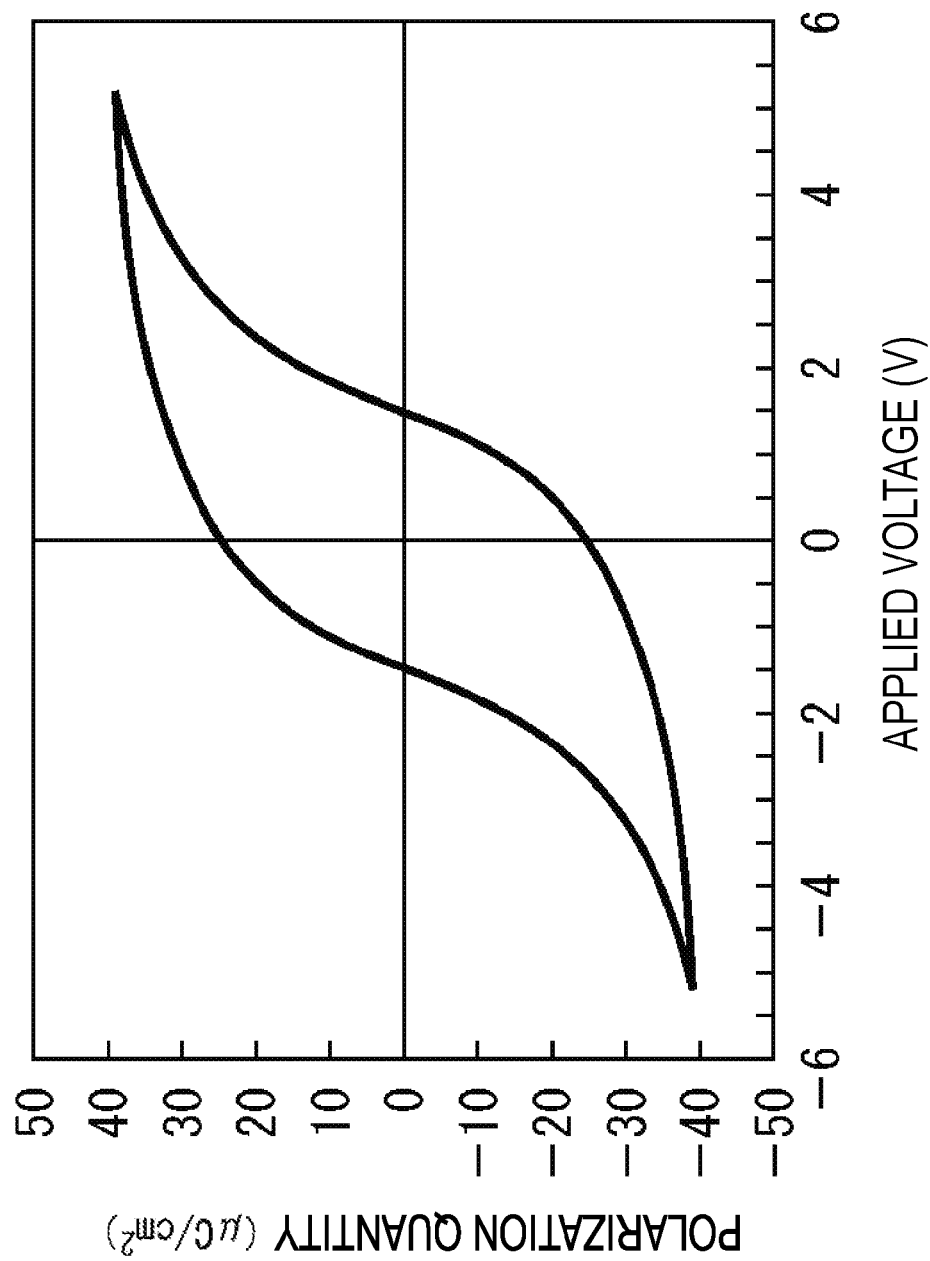
FIG. 15 is a graph showing the relationship between the voltage applied to a ferroelectric film and polarization quantity.

As the cause of damage as described above, thermal depolarization is considered. Thermal depolarization is a phenomenon of decrease in a residual polarization quantity when a ferroelectric substance is heated in a polarized state. Here, thermal depolarization will be described. FIG. 15 is a graph showing the relationship between the voltage applied to a ferroelectric film and polarization quantity.

Figure 16:
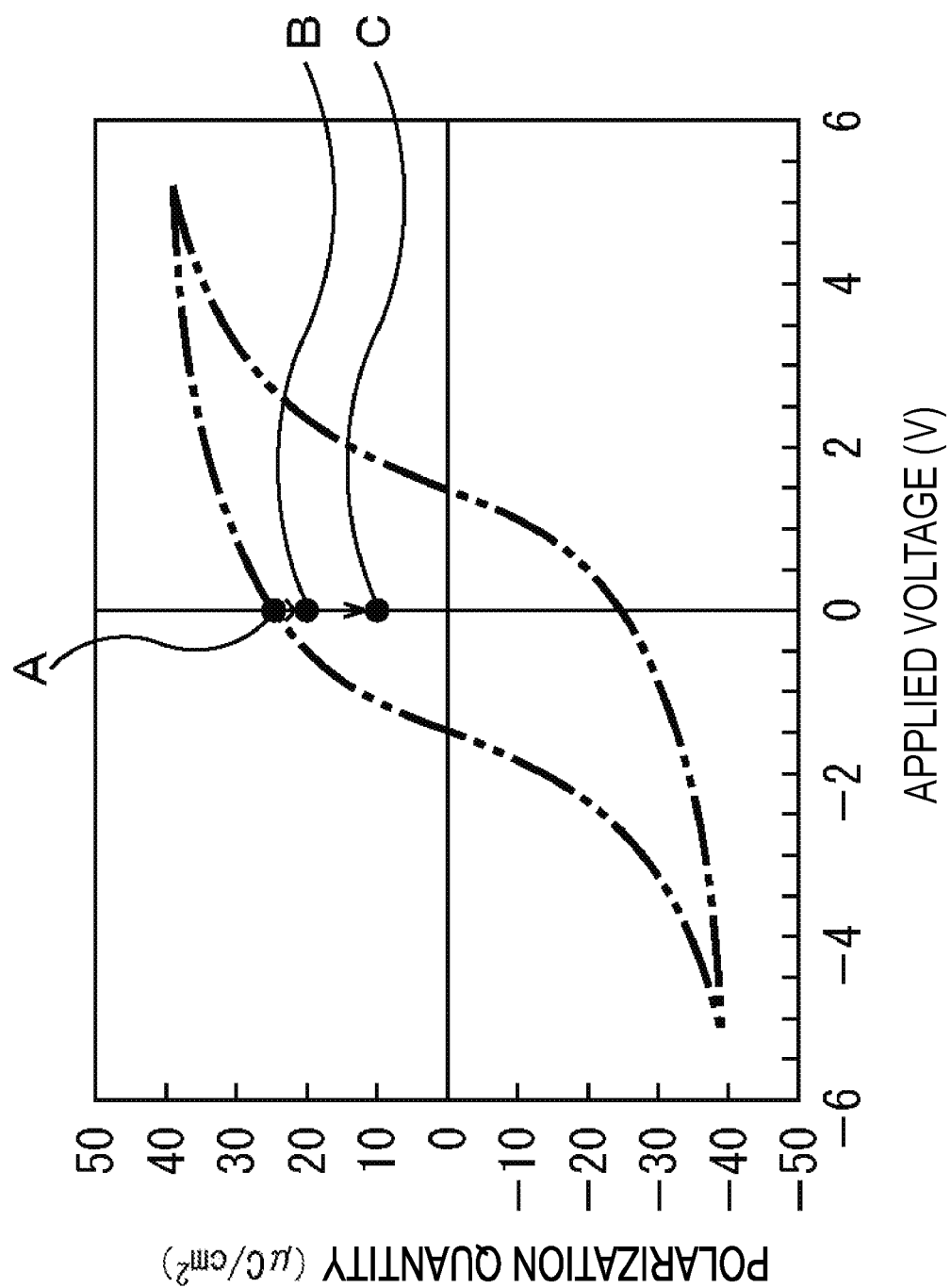
FIG. 16 is a graph showing thermal depolarization.

In a normal ferroelectric film, the hysteresis loop as shown in FIG. 15 is obtained. When a voltage by which polarization quantity is saturated is applied to such a ferroelectric film, even if the applied voltage is lowered to 0 V thereafter, the ferroelectric film remains in a polarized state (FIG. 16). In Steps S103 and S106 of a conventional test, thermal load is applied in such a state. If thermal load is applied in such a state, residual polarization quantity lowers. For example, if heating to 90° C. is performed, polarization quantity lowers from A to B; and if heating to 200° C. is performed, polarization quantity lowers from A to C. Specifically, the larger the thermal load, the more the residual polarization quantity lowers.

Figure 17:
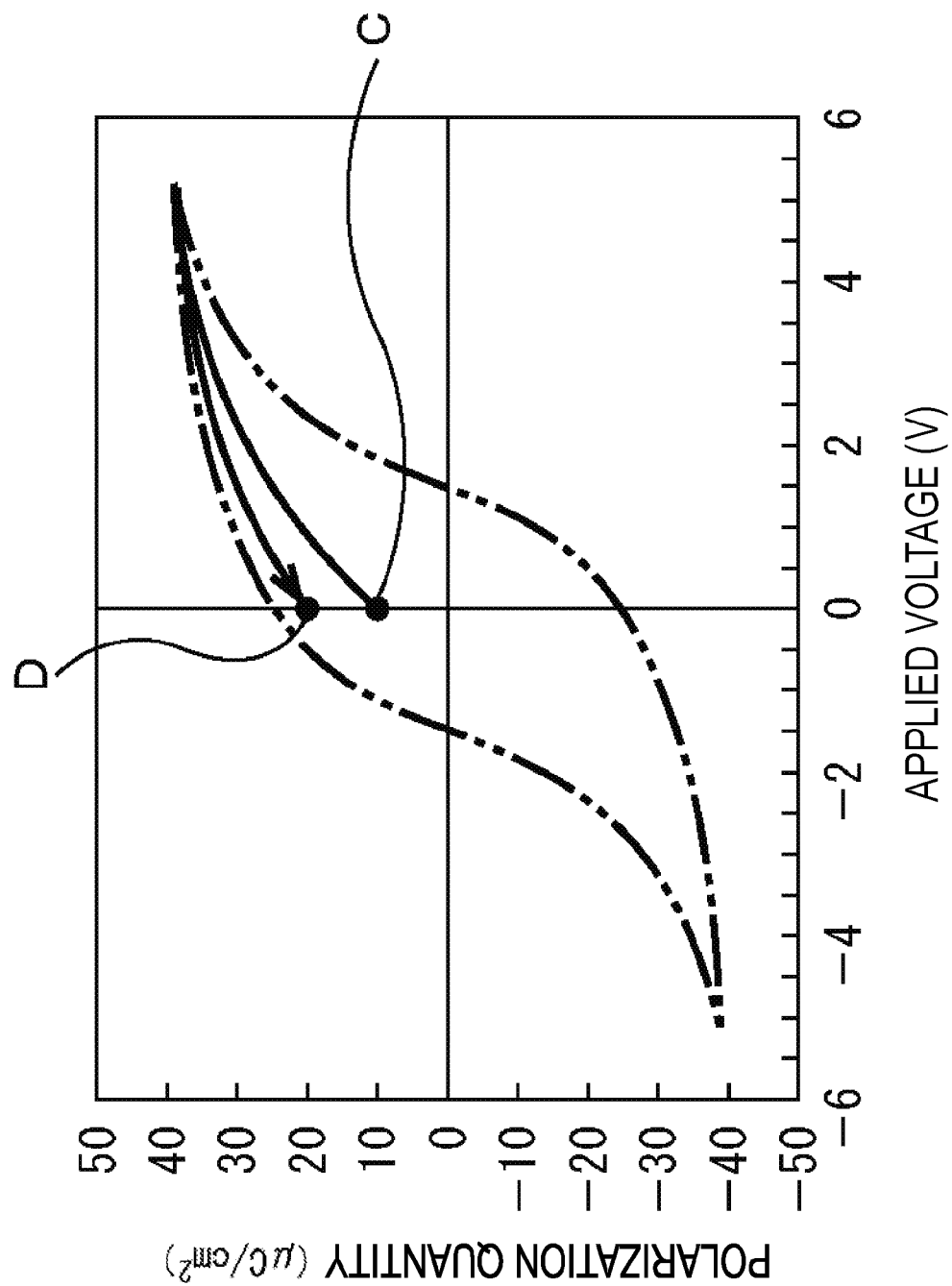
FIG. 17 is a graph showing the effect of thermal depolarization.

In order to read data thereafter from the polarized state of the ferroelectric film, since a predetermined voltage is applied to the ferroelectric film, if the applied voltage is lowered to 0 V thereafter, the residual polarization quantity recovers from C to D as shown in FIG. 17. However, the residual polarization quantity cannot be recovered to the initial value (A). This applies to the case wherein the residual polarization quantity lowers from A to B. Thereby the residual polarization quantity is lowered.

The above-described transition of the hysteresis loop and lowering of symmetry are also considered to be due to the effect of thermal load.

Therefore, it is considered that thermal load is preferably not applied. However, when the present inventors changed the temperature of thermal load in the conventional testing method to 150° C., sufficient tests could not be conducted. Also when the time of thermal load was made to be one hour, sufficient tests could not be conducted. Specifically, in either case, chips causing defective operation in a short time from the start of use could not be detected in the equivalent degree of conventional tests.

The present inventors repeated keen examinations, and attained the following countermeasures.

(Method for Manufacturing Ferroelectric Memory)

First, a method for manufacturing ferroelectric memory will be described. Although a method for manufacturing ferroelectric memory equipped with a ferroelectric memory cell section, a logical circuit section, a peripheral circuit section, and a pad section will be described here, in the following description, the ferroelectric memory cell section will be mainly described. FIGS. 1A to 1M are sectional views showing a method for manufacturing a ferroelectric memory in order of processes.

Figure 1A:
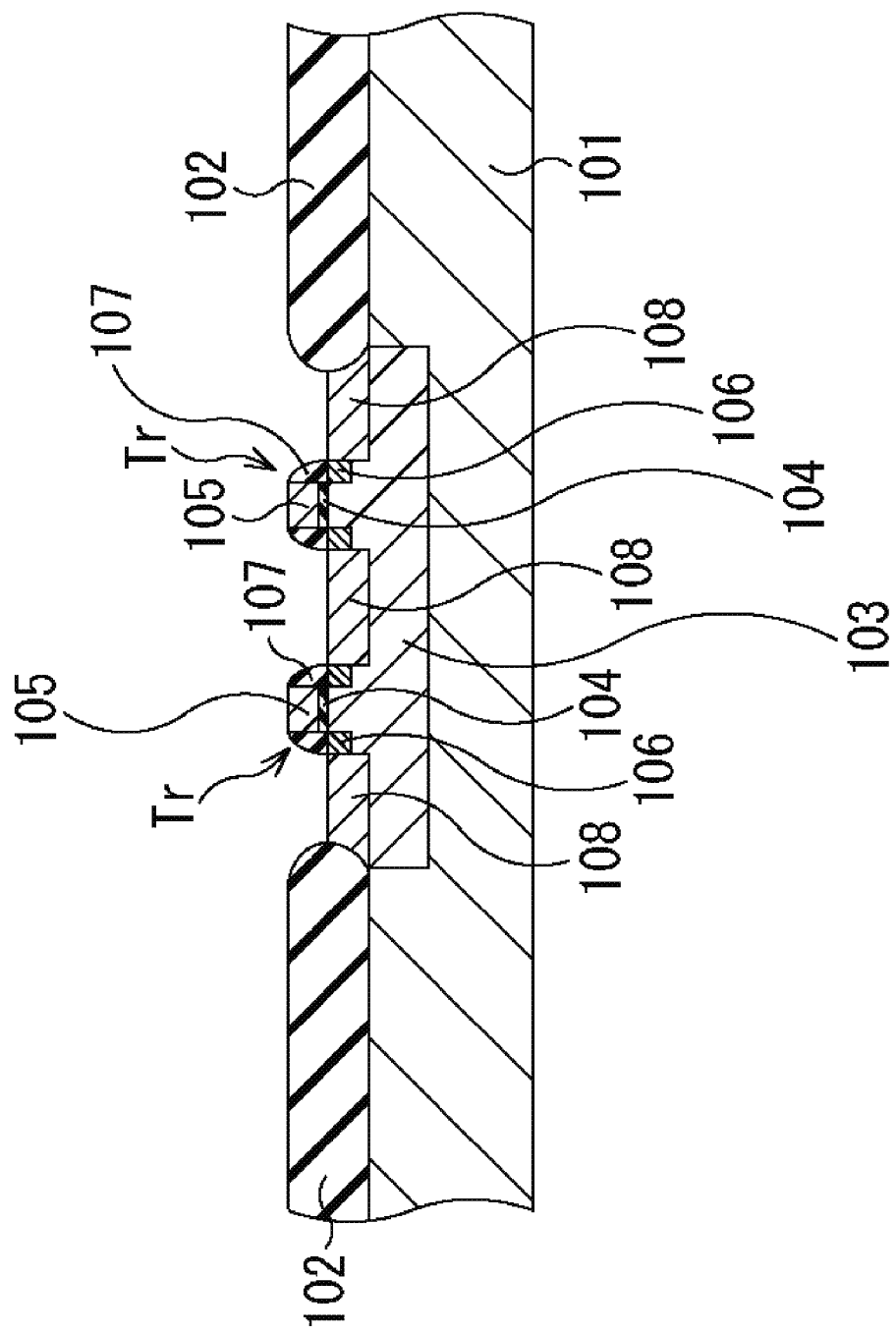

First, as shown in FIG. 1A, an element isolating insulation film 102 is formed on the surface of a semiconductor substrate 101 composed of silicon or the like. The element isolating insulation film 102 is formed using, for example, a LOCOS (local oxidation of silicon) method or an STI (shallow trench isolation) method. Next, ions of a P-type impurity (for example, B (boron)) are implanted into the surface of an element region defined by the element isolating insulation film 102 to form a P-well 103. Then, gate insulation films 104 and gate electrodes 105 are formed on the P-well 103. Thereafter, ions of an N-type impurity (for example, P (phosphorus)) are implanted into the surface of the P-well 103 to form a shallow impurity diffused layer 106. Then, a sidewall insulation film 107 is formed on the side of each of the gate electrodes 105. Next, ions of an N-type impurity (for example, As (arsenic)) are implanted into the surface of the P-well 103 to form deep impurity diffused layers 108. Thereby, transistors Tr are formed. The channel length of a transistor Tr is not specifically limited, but is, for example, 360 μm. The gate insulation films 104 are silicon oxide films each having a thickness of, for example, 6 nm to 7 nm; and each of the gate electrodes 105 is composed of, for example, an amorphous silicon layer having a thickness of about 50 nm and a tungsten silicide layer having a thickness of about 150 nm formed thereon. Each of the transistors Tr contains two impurity diffused layers 108 one of which is shared by another transistor Tr. The shared impurity diffused layer 108 composes the drain, and impurity diffused layers 108 not shared compose sources.

Figure 1B:
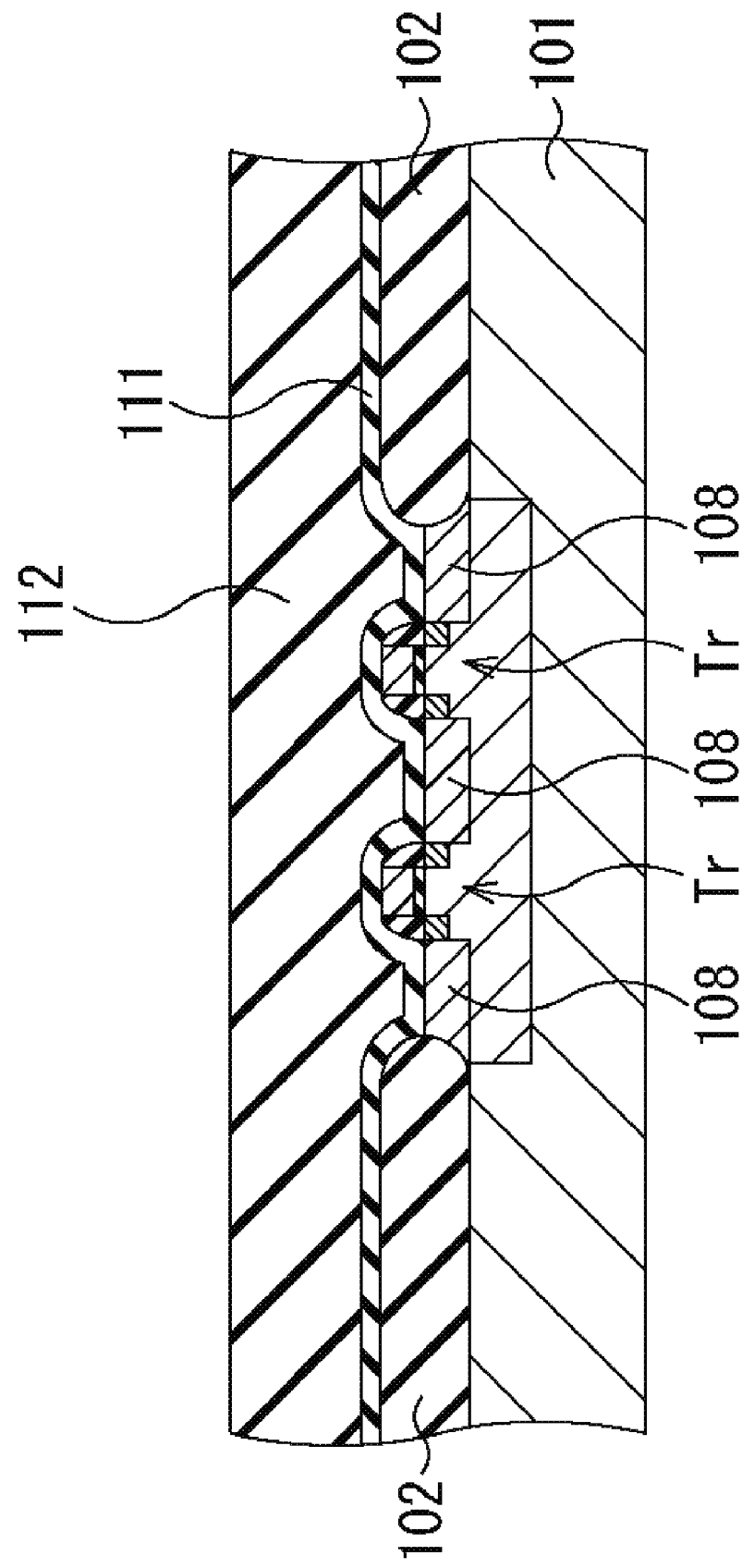

Next, as shown in FIG. 1B, a silicon nitride film 111 that covers the transistors Tr is formed by a plasma CVD method or the like, and a NSG (non-doped silicate glass) film 112 is formed thereon by a plasma CVD method using TEOS (tetraethylorthosilicate). The thickness of the silicon nitride film 111 is about 200 nm, and the thickness of the NSG film 112 is about 600 nm. Next, the surface of the NSG film 112 is planarized by grinding the surface by about 200 nm.

Figure 1C:
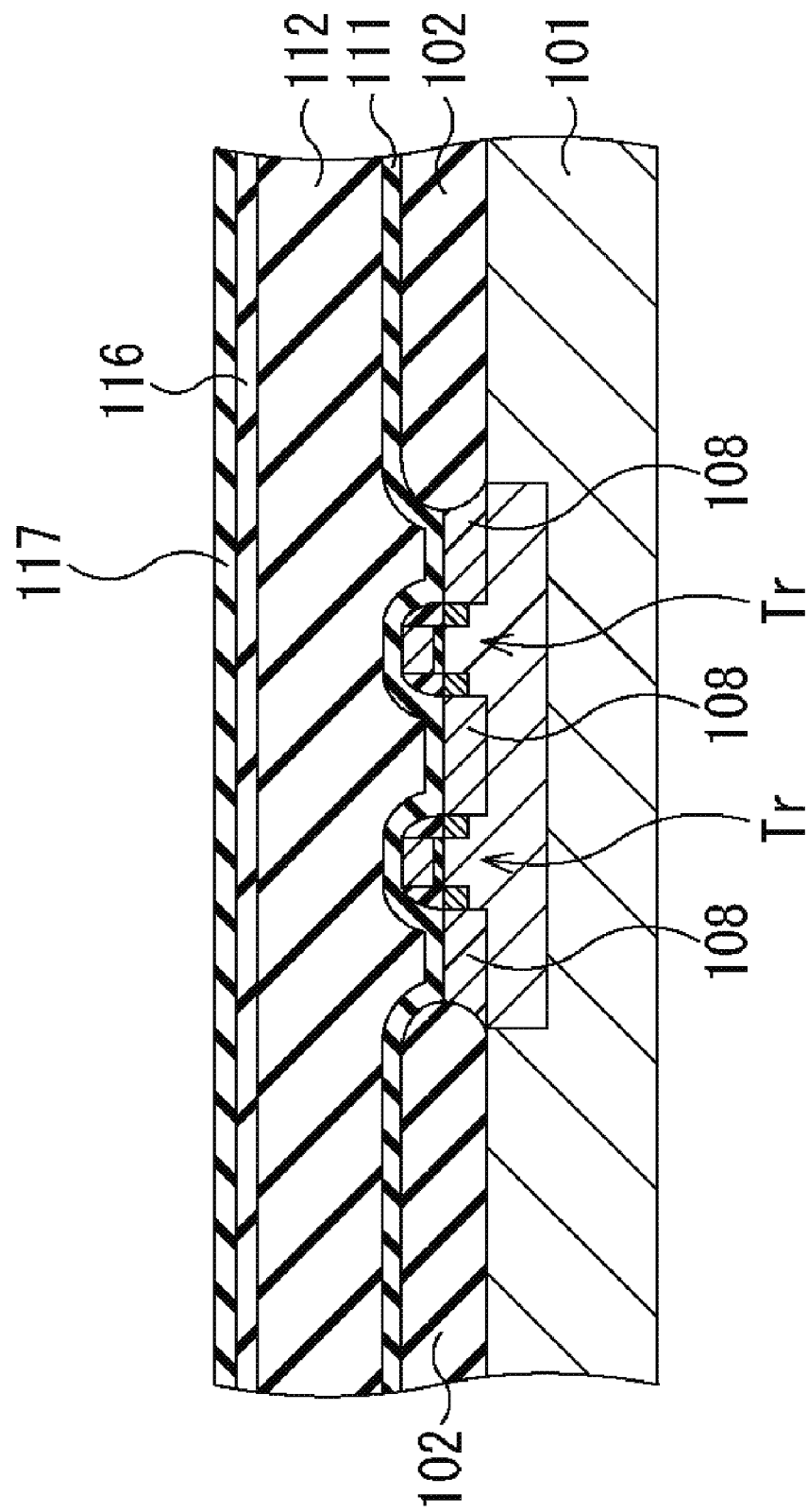

Thereafter, as shown in FIG. 1C, a NSG film 116 having a thickness of about 100 nm is formed on the NSG film 112 by a plasma CVD method using TEOS, and the dehydration thereof is performed. In dehydration, the temperature of the semiconductor substrate 101 is 650° C., the time for treatment is 30 minutes, and the flow rate of supplied nitrogen gas is 2 L (liter)/min. Next, an aluminum oxide film 117 having a thickness of about 20 nm is formed on the NSG film 116 by a PVD method or the like, and heat treatment is performed. In the heat treatment, RTA is performed under conditions of, for example, the temperature of the semiconductor substrate 101 of 650° C., the time for the treatment of 60 seconds, and the flow rate of supplied oxygen gas of 2 L (liter)/min.

Figure 1D:
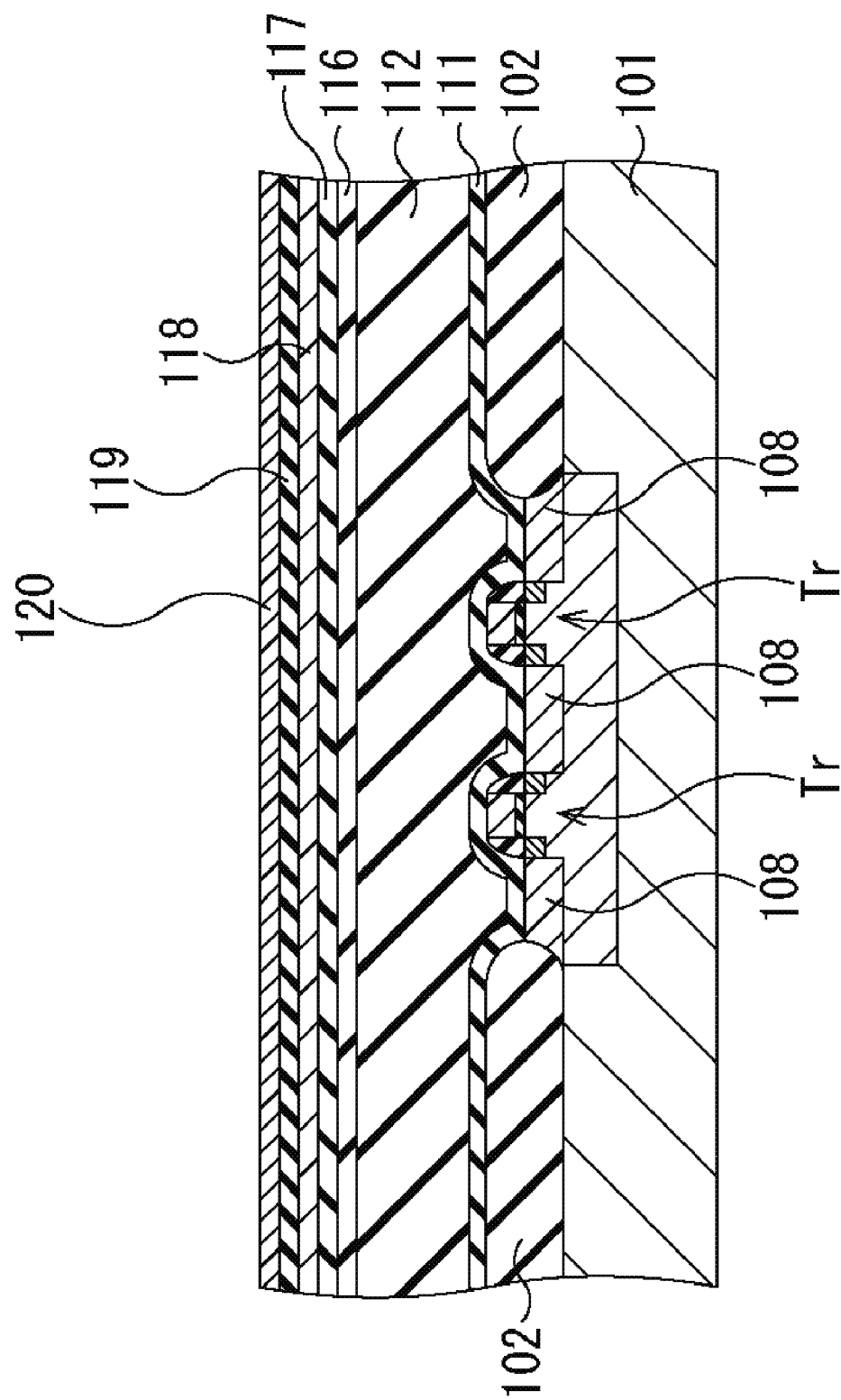

Next, as shown in FIG. 1D, a platinum film 118, a PZT film 119, and an iridium oxide film 120 are sequentially formed on the aluminum oxide film 117 by a PVD method or the like. For example, the thickness of the platinum film 118 is 155 nm, the thickness of the PZT film 119 is about 150 nm to 200 nm, and the thickness of the iridium oxide film 120 is 250 nm. However, heat treatment is performed between the formation of the PZT film 119 and the formation of the iridium oxide film 120. In the heat treatment, RTA is performed under conditions of the temperature of the semiconductor substrate 101 of 563° C., the time for the treatment of 90 seconds, the flow rate of supplied oxygen gas of 0.055 L (liter)/min, and the flow rate of supplied argon gas of 1.95 L (liter)/min. The iridium oxide film 120 has a two-layer structure, and heat treatment is performed also after the lower layer (thickness: 50 nm) has been formed. In the heat treatment, RTA is performed under conditions of the temperature of the semiconductor substrate 101 of 708° C., the time for the treatment of 20 seconds, the flow rate of supplied oxygen gas of 0.02 L (liter)/min, and the flow rate of supplied argon gas of 2.00 L (liter)/min.

Thereafter, as shown in FIG. 1E, the iridium oxide film 120 is subjected to patterning, and recovery annealing is performed. The recovery annealing is performed, for example, in a vertical furnace, under conditions of the temperature of the semiconductor substrate 101 of 650° C., the time for the treatment of 60 minutes, and the flow rate of supplied oxygen gas of 20 L (liter)/min. Then, the PZT film 119 is subjected to patterning, and recovery annealing is performed. The recovery annealing is performed, for example, in a vertical furnace, under conditions of the temperature of the semiconductor substrate 101 of 350° C., the time for the treatment of 60 minutes, and the flow rate of supplied oxygen gas of 20 L (liter)/min. Next, an aluminum oxide film 121 having a thickness of about 50 nm is formed on the entire surface by a PVD method or the like, and recovery annealing is performed. The recovery annealing is performed, for example, in a vertical furnace, under conditions of the temperature of the semiconductor substrate 101 of 550° C., the time for the treatment of 60 minutes, and the flow rate of supplied oxygen gas of 20 L (liter)/min.

Figure 1F:
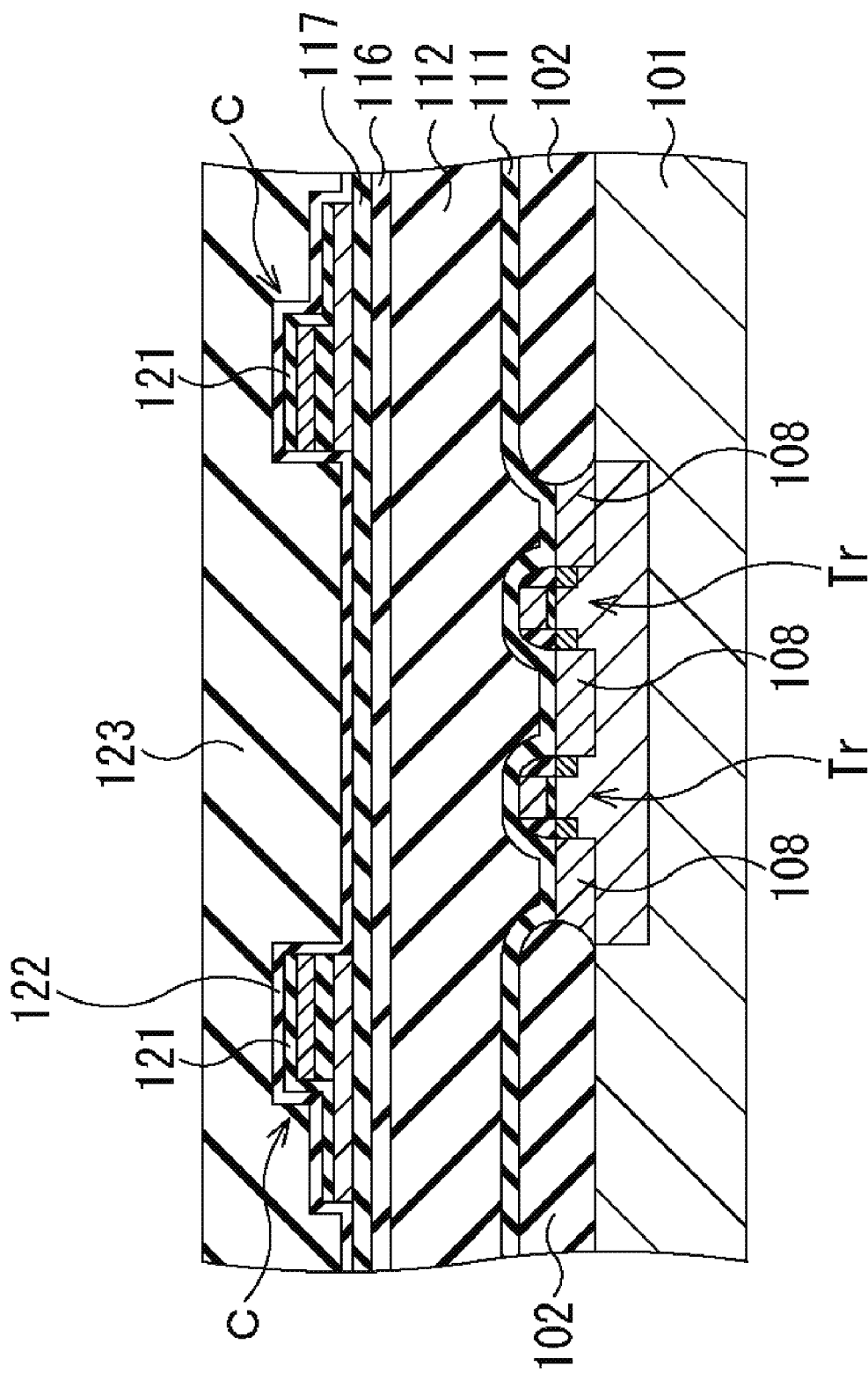

Then, as shown in FIG. 1F, the aluminum oxide film 121 and the platinum film 118 are subjected to patterning.

Thereby, a ferroelectric capacitor C is formed. Thereafter, recovery annealing is performed. The recovery annealing is performed, for example, in a vertical furnace, under conditions of the temperature of the semiconductor substrate 101 of 650° C., the time for the treatment of 60 minutes, and the flow rate of supplied oxygen gas of 20 L (liter)/min. Next, an aluminum oxide film 122 having a thickness of about 20 nm is formed on the entire surface by a PVD method or the like, and recovery annealing is performed. The recovery annealing is performed, for example, in a vertical furnace, under conditions of the temperature of the semiconductor substrate 101 of 550° C., the time for the treatment of 60 minutes, and the flow rate of supplied oxygen gas of 20 L (liter)/min. Then, an NSG film 123 having a thickness of about 1500 nm is formed on the aluminum oxide film 122 by a plasma CVD method using TEOS, and the surface is planarized.

Next, plasma annealing is performed in a nitrogen atmosphere to nitride the surface of the NSG film 123. The plasma annealing is performed, for example, in a CVD apparatus or the like, under conditions of the temperature of the semiconductor substrate 101 of 350° C., and the time for the treatment of 2 minutes, to generate $N_2O$ plasma. Then, as shown in FIG. 1G, a resist pattern 191 having openings in predetermined locations is formed on the NSG film 123. Thereafter, the NSG film 123 and the like are etched using the resist pattern 191 as a mask to form a contact hole 113s reaching the source and contact holes 113d reaching the drain.

Then, as shown in FIG. 1H, the resist pattern 191 is removed. Next, a barrier metal film (not shown) having a thickness of about 70 nm is formed on the entire surface by, for example, a PVD method, and a tungsten film (not shown) having a thickness of about 500 nm is formed thereon by, for example, a CVD method. For forming the barrier metal film, for example, after forming a titanium film having a thickness of about 20 nm, a titanium nitride film having a thickness of about 50 nm is formed. Then, the tungsten film and the barrier metal film are polished until the NSG film 123 is exposed by, for example, a CMP method. As a result, a contact plug 114s is formed in the contact hole 113s, and contact plugs 114d are formed in the contact holes 113d. Then, plasma annealing is performed in a nitrogen atmosphere to nitride the surface of the NSG film 123. The plasma annealing is performed, for example, in a CVD apparatus or the like, under conditions of the temperature of the semiconductor substrate 101 of 350° C., and the time for the treatment of 2 minutes, to generate $N_2O$ plasma. Thereafter, a silicon oxynitride film 115 having a thickness of about 100 nm is formed by a plasma CVD method or the like. The thickness of the silicon oxynitride film 115 is preferably about 50 nm to 200 nm. If the silicon oxynitride film 115 is excessively thick, subsequent processing may become difficult; and if the silicon oxynitride film 115 is excessively thin, the effect to prevent the permeation of water may be insufficient. In place of the silicon oxynitride film 115, other films containing nitrogen may also be formed.

Next, as shown in FIG. 1I, a resist pattern 192 having openings in predetermined locations is formed on the silicon oxynitride film 115. Thereafter, the silicon oxynitride film 115 and the like are etched using the resist pattern 192 as a mask to form contact holes 127t reaching the upper electrode (iridium oxide film 120) and contact holes 127b reaching the lower electrode (platinum film 118).

Figure 1J:
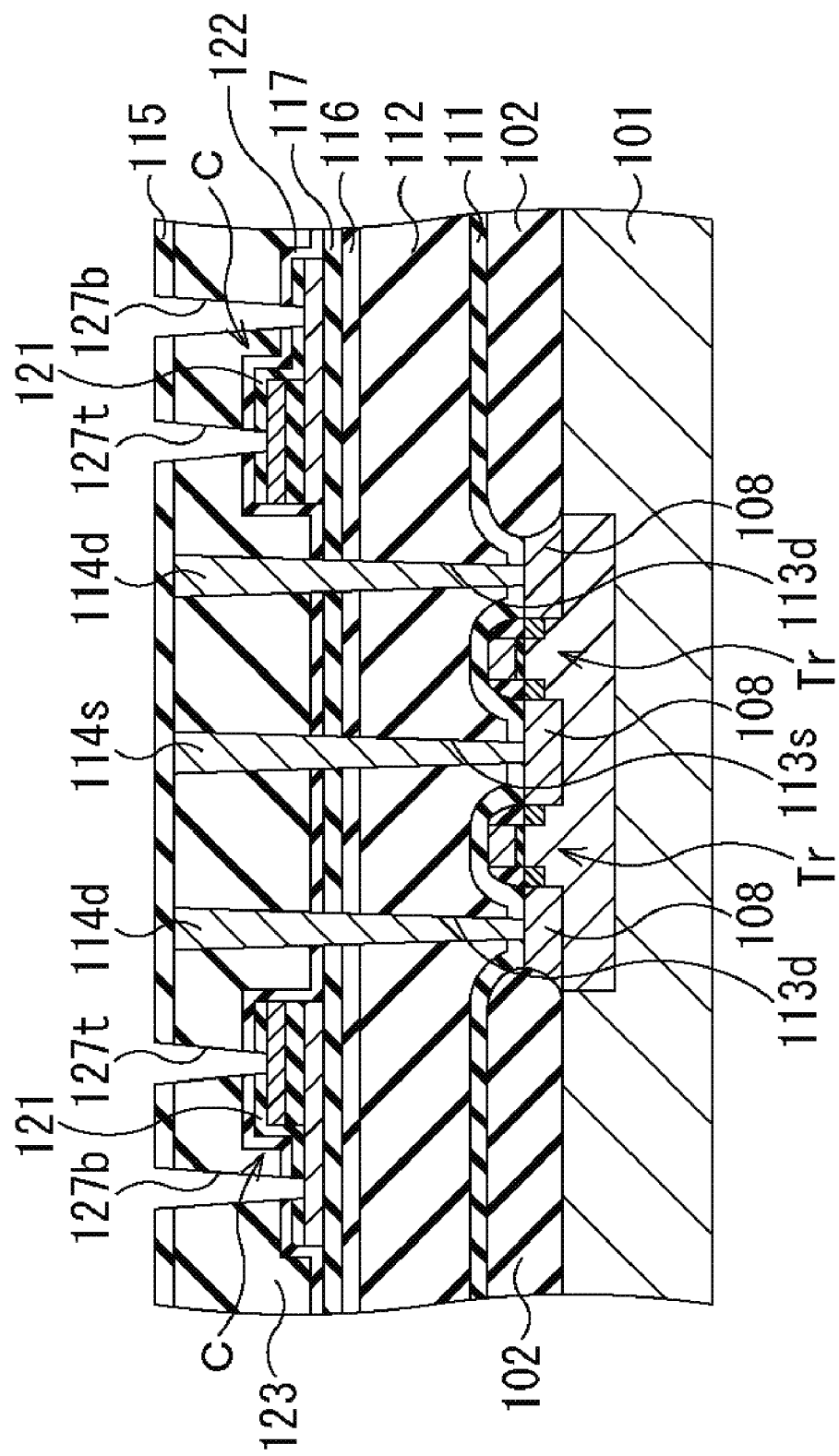

Thereafter, as shown in FIG. 1J, the resist pattern 192 is removed, and recovery annealing is performed. The recovery annealing is performed, for example, in a vertical furnace, under conditions of the temperature of the semiconductor substrate 101 of 500° C., the time for the treatment of 60 minutes, and the flow rate of supplied oxygen gas of 20 L (liter)/min.

Figure 1K:
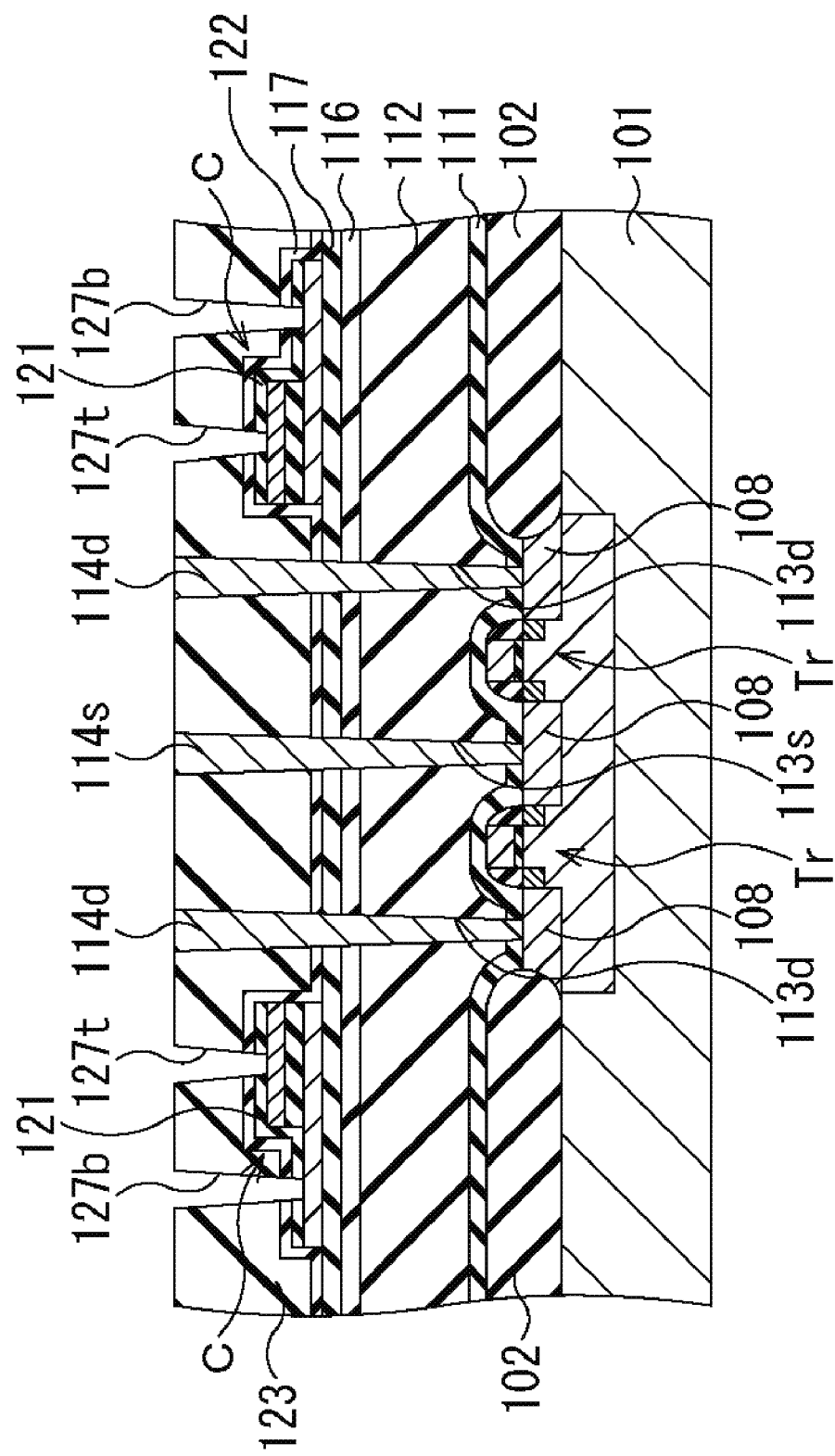

Then, as shown in FIG. 1K, the silicon oxynitride film 115 is removed by etch back.

Figure 1L:
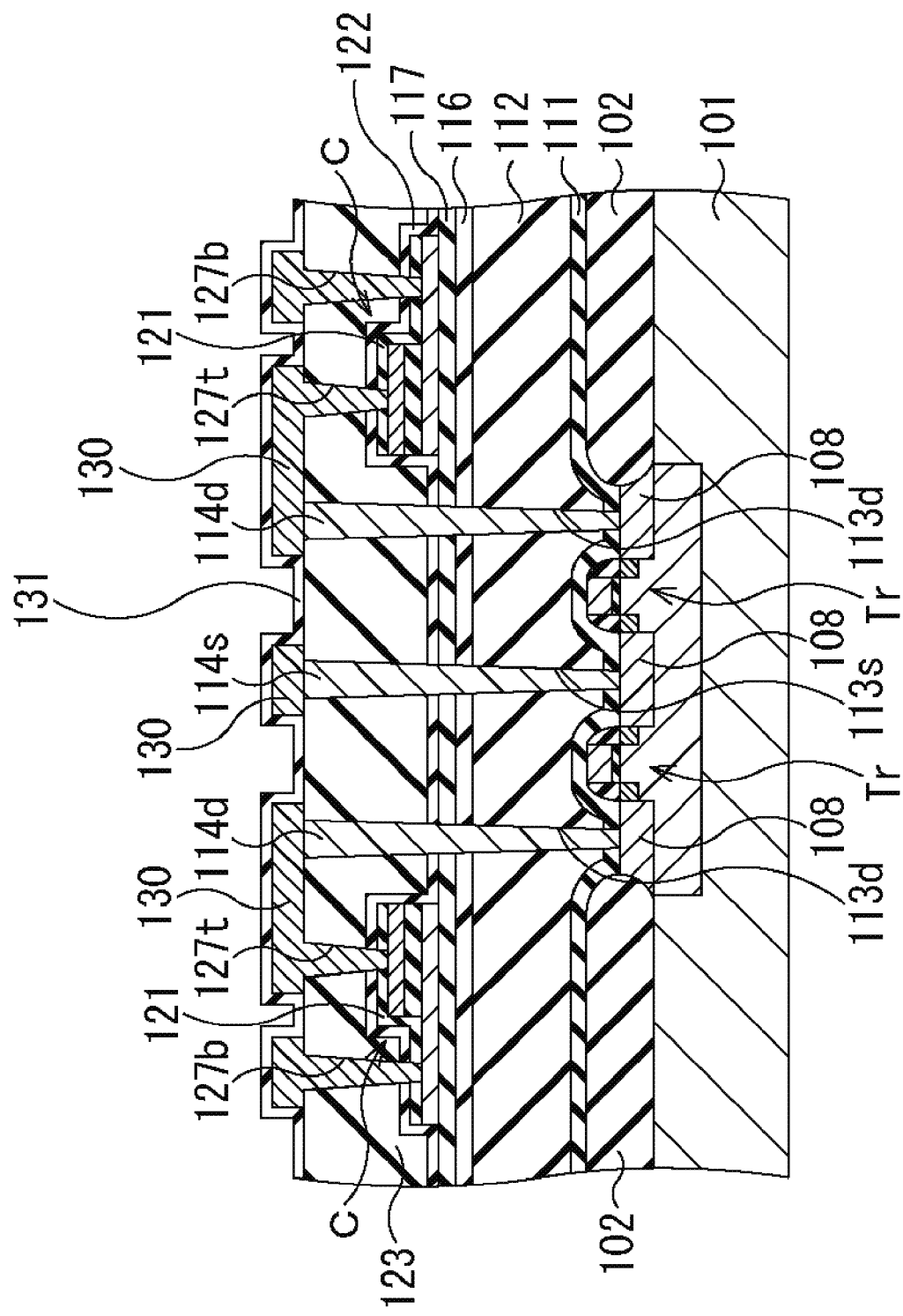

Next, as shown in FIG. 1L, wirings 130 contacting the contact plug 114s, the contact plugs 114d, the upper electrode (iridium oxide film 120), and the lower electrode (platinum film 118) are formed. For forming the wirings 130, first, a titanium nitride film having a thickness of about 150 nm, an Al—CU alloy film having a thickness of about 550 nm, a titanium film having a thickness of about 5 nm, and a titanium nitride film having a thickness of about 150 nm are sequentially formed by a PVD method or the like. Next, these films are subjected to patterning. Thereafter, heat treatment is performed in a vertical furnace, under conditions of the temperature of the semiconductor substrate 101 of 350° C., the time for the treatment of 30 minutes, and the flow rate of supplied nitrogen gas of 20 L (liter)/min. Then, an aluminum oxide film 131 having a thickness of about 20 nm is formed on the entire surface by a PVD method or the like.

Figure 1M:
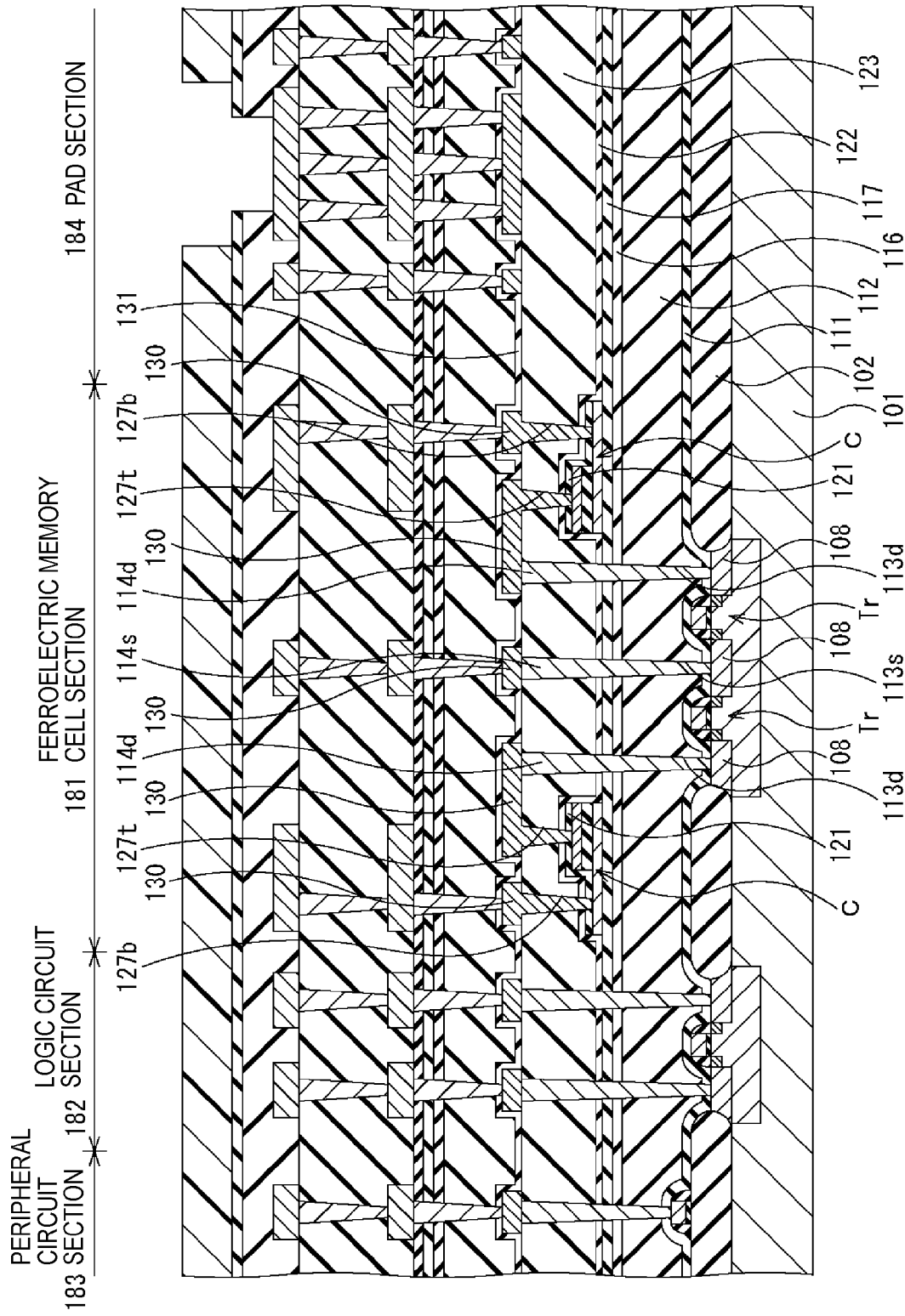

Thereafter as shown in FIG. 1M, an upper layer wiring is formed. Although not shown in FIGS. 1A to 1L, transistors, wirings and the like are formed not only in the ferroelectric memory cell section 181, but in the logic circuit section 182, the peripheral circuit section 183, and the pad section 184.

(Characteristics of Ferroelectric Capacitor)

Figure 2:
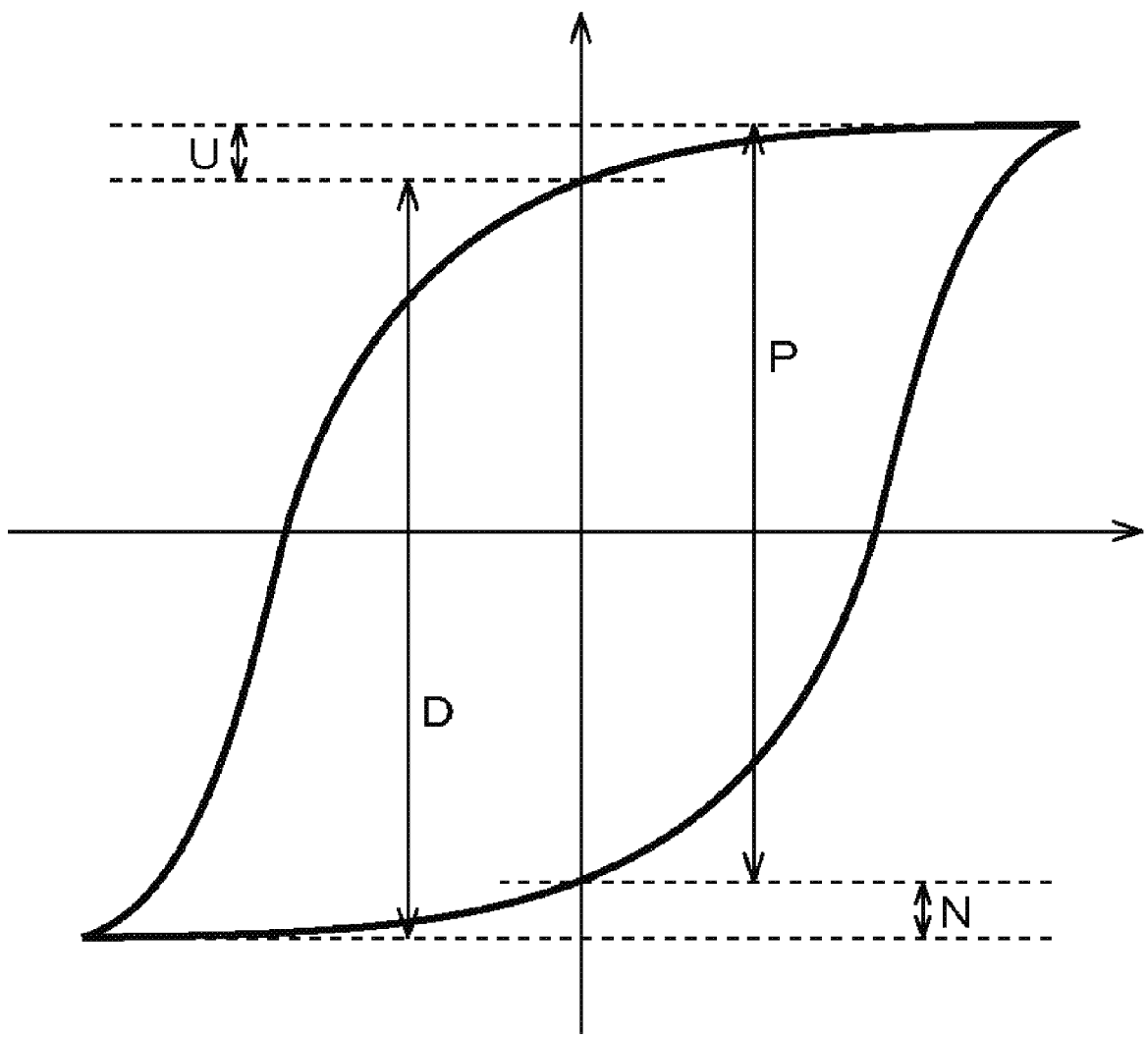
FIG. 2 is a diagram showing various values obtained from a hysteresis loop.

Next, the characteristics of a ferroelectric capacitor will be described. First, the definitions for various values obtained from the hysteresis loop showing the relationship between an applied voltage and a polarization quantity will be described. A value obtained from "(saturated polarization quantity when positive voltage is applied)−(negative residual polarization quantity)" is defined as P. A value obtained from "(saturated polarization quantity when positive voltage is applied)−(positive residual polarization quantity)" is defined as U. A value obtained from "(positive residual polarization quantity)−(saturated polarization quantity when negative voltage is applied) is defined as D. A value obtained from "(negative residual polarization quantity)−(saturated polarization quantity when negative voltage is applied) is defined as N. The voltage described here is a value obtained from "(potential of lower electrode)−(potential of upper electrode). These are collectively illustrated in FIG. 2.

The present inventors compared the characteristics of a ferroelectric capacitor judged as acceptable in a conventional test with a ferroelectric capacitor judged as defective in the same test, and found that there were various differences.

Firstly, even by the thermal load of 90° C., the lowering of the residual polarization quantity (depolarization) $\Delta Qa$ of a ferroelectric capacitor judged as acceptable tends to be smaller than the depolarization $\Delta Qb$ of a ferroelectric capacitor judged as defective. FIG. 3A is a graph showing the lowering of the residual polarization quantity of a ferroelectric capacitor judged to be acceptable; and FIG. 3B is a graph showing the lowering of the residual polarization quantity of a ferroelectric capacitor judged to be defective. Solid lines in FIGS. 3A and 3B show the hysteresis loop measured at room temperature; broken lines show the hysteresis loop measured at 90° C. As shown in FIGS. 3A and 3B, the depolarization quantity is large in the ferroelectric capacitor judged as defective. Therefore, it is said that if the threshold value to distinguish between acceptable and defective is set in the rate of the depolarization quantity to the residual polarization quantity before applying thermal load (depolarization rate), by comparing with the threshold value, the test can be conducted without applying thermal load that deteriorates the ferroelectric capacitor.

Figure 4A:
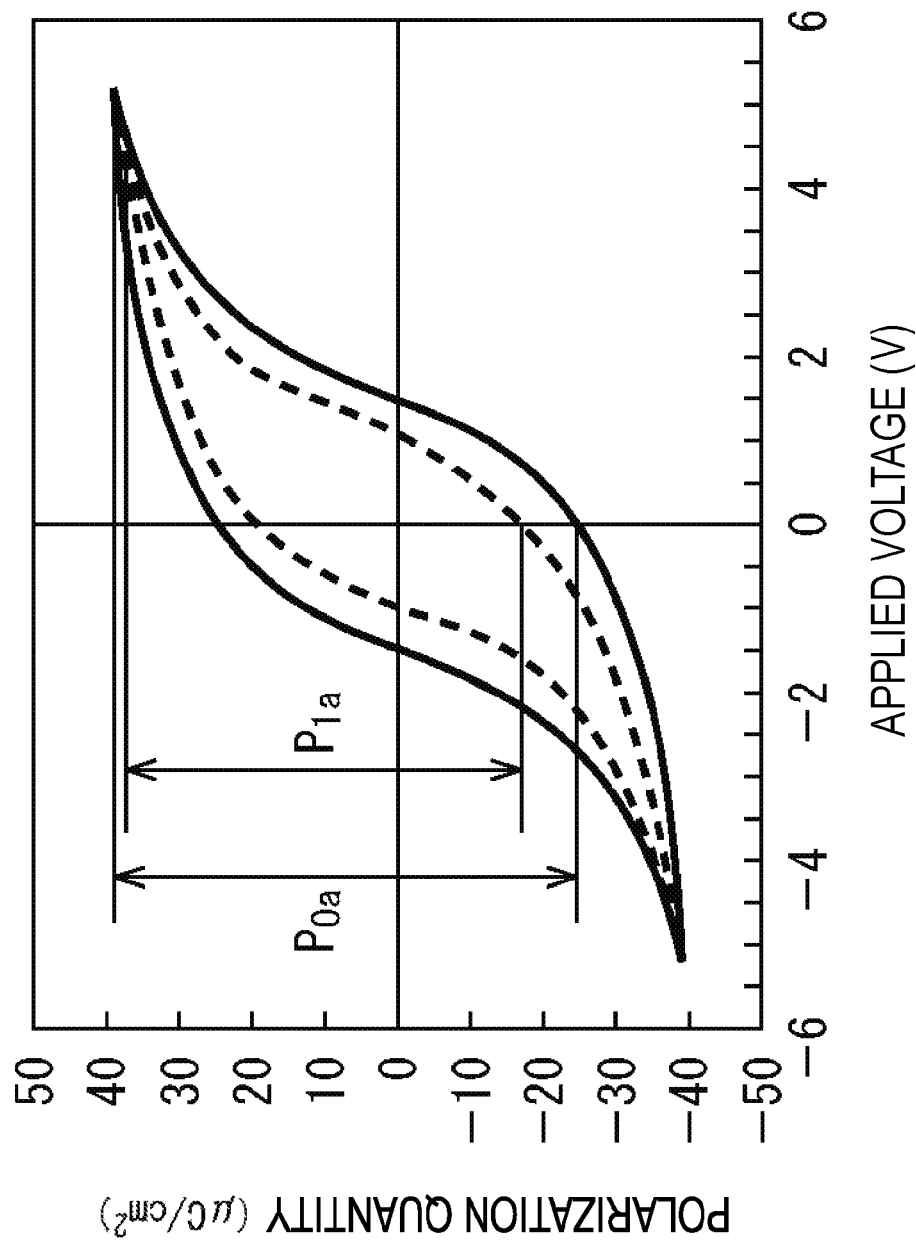
FIG. 4A is a graph showing the change in value P of a ferroelectric capacitor judged to be acceptable.
Figure 4B:
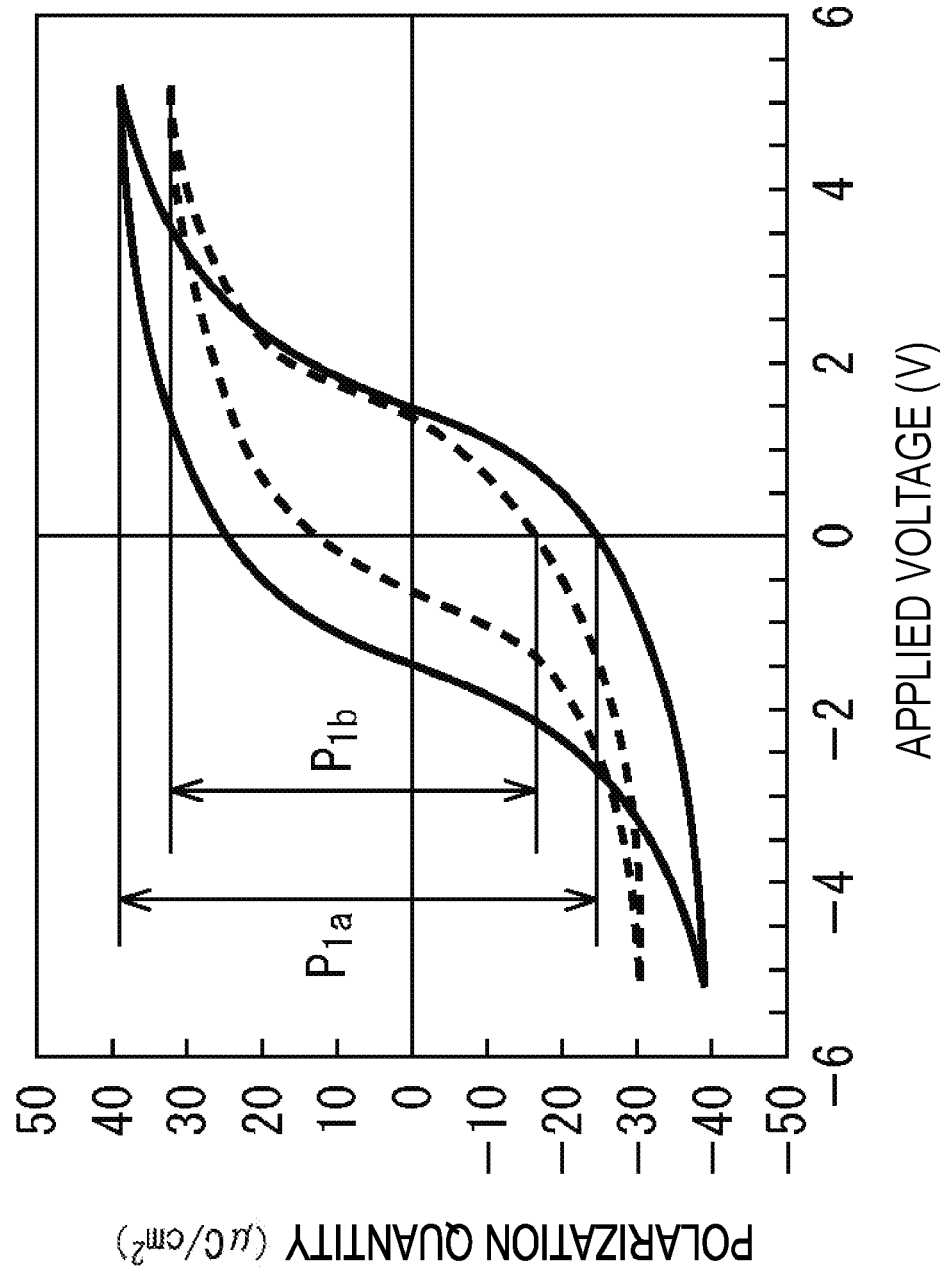
FIG. 4B is a graph showing the change in value P of a ferroelectric capacitor judged to be defective.

Secondly, even by the thermal load of 90° C., the change in the value P, ΔP0 ("P0a–P1a" in FIG. 4A), of a ferroelectric capacitor judged as acceptable tends to be smaller than the change in the value P, ΔP1 ("P1a–P1b" in FIG. 4B), of a ferroelectric capacitor judged as defective. FIG. 4A is a graph showing the change in the value P of a ferroelectric capacitor judged to be acceptable; and FIG. 4B is a graph showing the change in the value P of a ferroelectric capacitor judged to be defective. As shown in FIGS. 4A and 4B, the change in the value P is large in a ferroelectric capacitor judged to be defective. Therefore, it is said that if the threshold value to distinguish between acceptable and defective is set in the rate of change in the value P to the value P before applying thermal load (rate of change), by comparing with the threshold value, the test can be conducted without applying thermal load that deteriorates the ferroelectric capacitor. This tendency also applies to values U, D, and N. Therefore, it is said that sufficient tests can be conducted using these values in place of the value P.

Figure 5A:
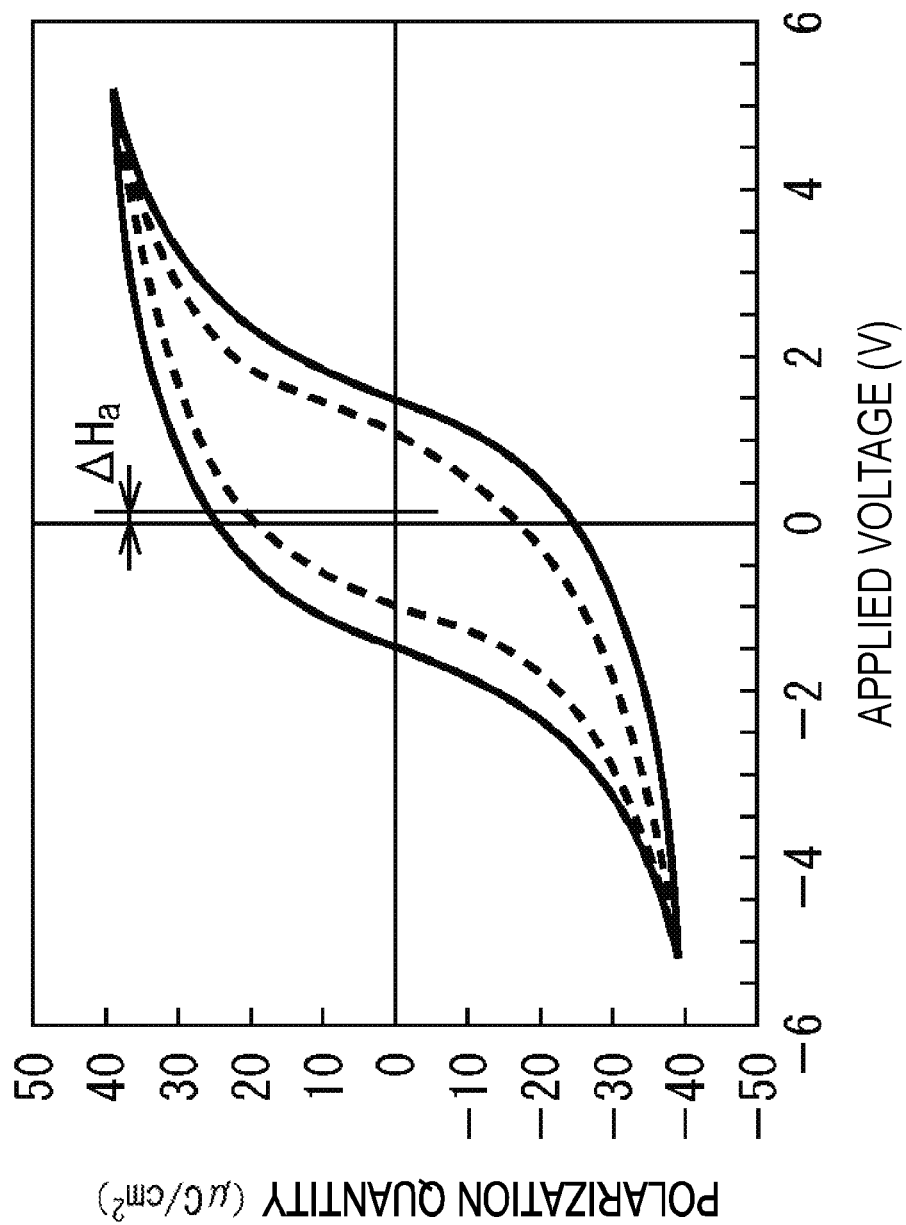
FIG. 5A is a graph showing the transition of the hysteresis loop of a ferroelectric capacitor judged to be acceptable.
Figure 5B:
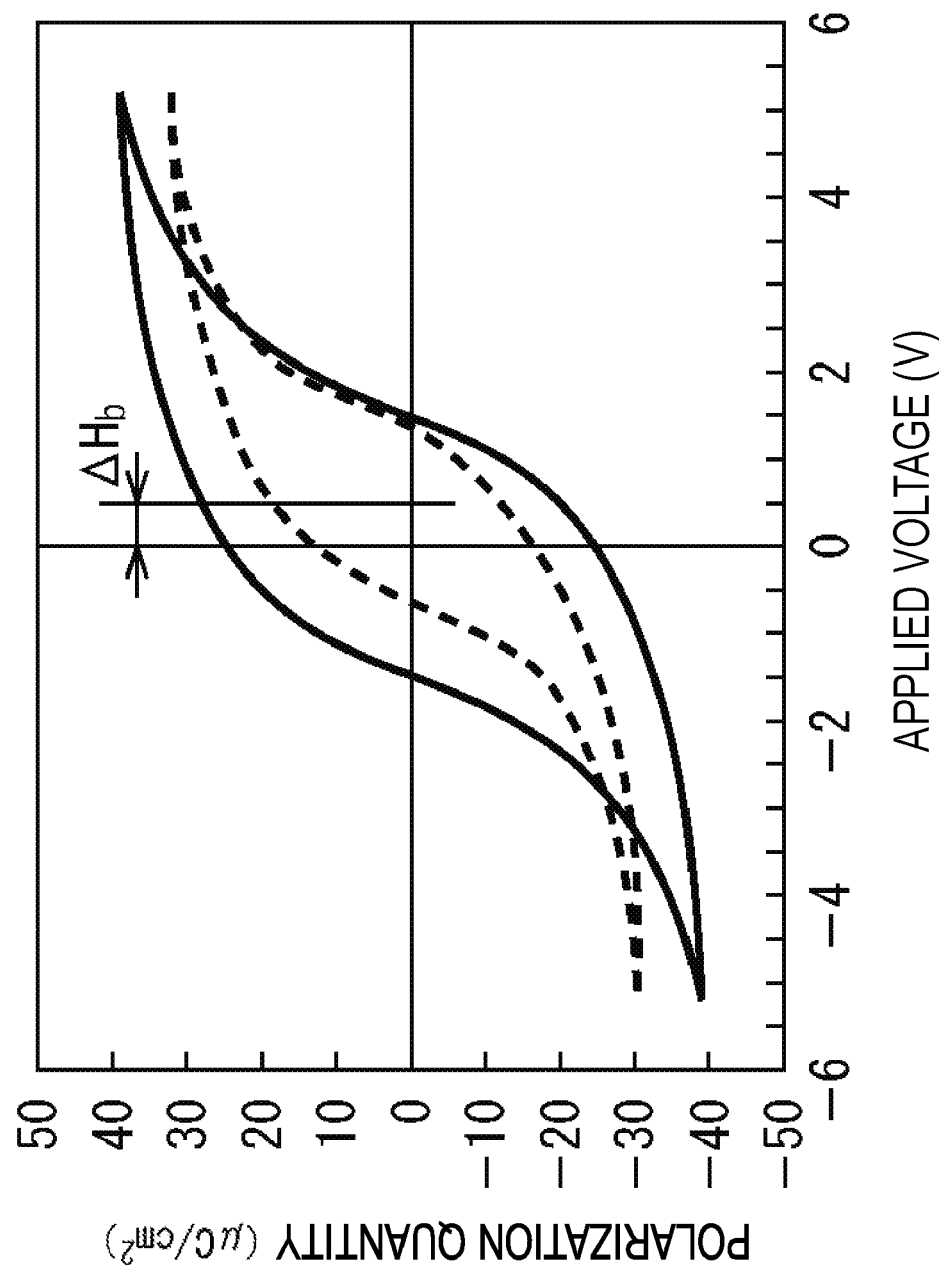
FIG. 5B is a graph showing the transition of the hysteresis loop of a ferroelectric capacitor judged to be defective.

Thirdly, even by the thermal load of 90° C., the transition of the hysteresis loop ΔHa of a ferroelectric capacitor judged as acceptable tends to be smaller than the transition of the hysteresis loop ΔHb of a ferroelectric capacitor judged as defective. FIG. 5A is a graph showing the transition of the hysteresis loop of a ferroelectric capacitor judged to be acceptable; and FIG. 5B is a graph showing the transition of the hysteresis loop of a ferroelectric capacitor judged to be defective. As shown in FIGS. 5A and 5B, the transition of the hysteresis loop is large in the ferroelectric capacitor judged as defective. Therefore, it is said that if the threshold value to distinguish between acceptable and defective is set in the standardized value of the transition of the hysteresis loop, by comparing with the threshold value, the test can be conducted without applying thermal load that deteriorates the ferroelectric capacitor.

Figure 6A:
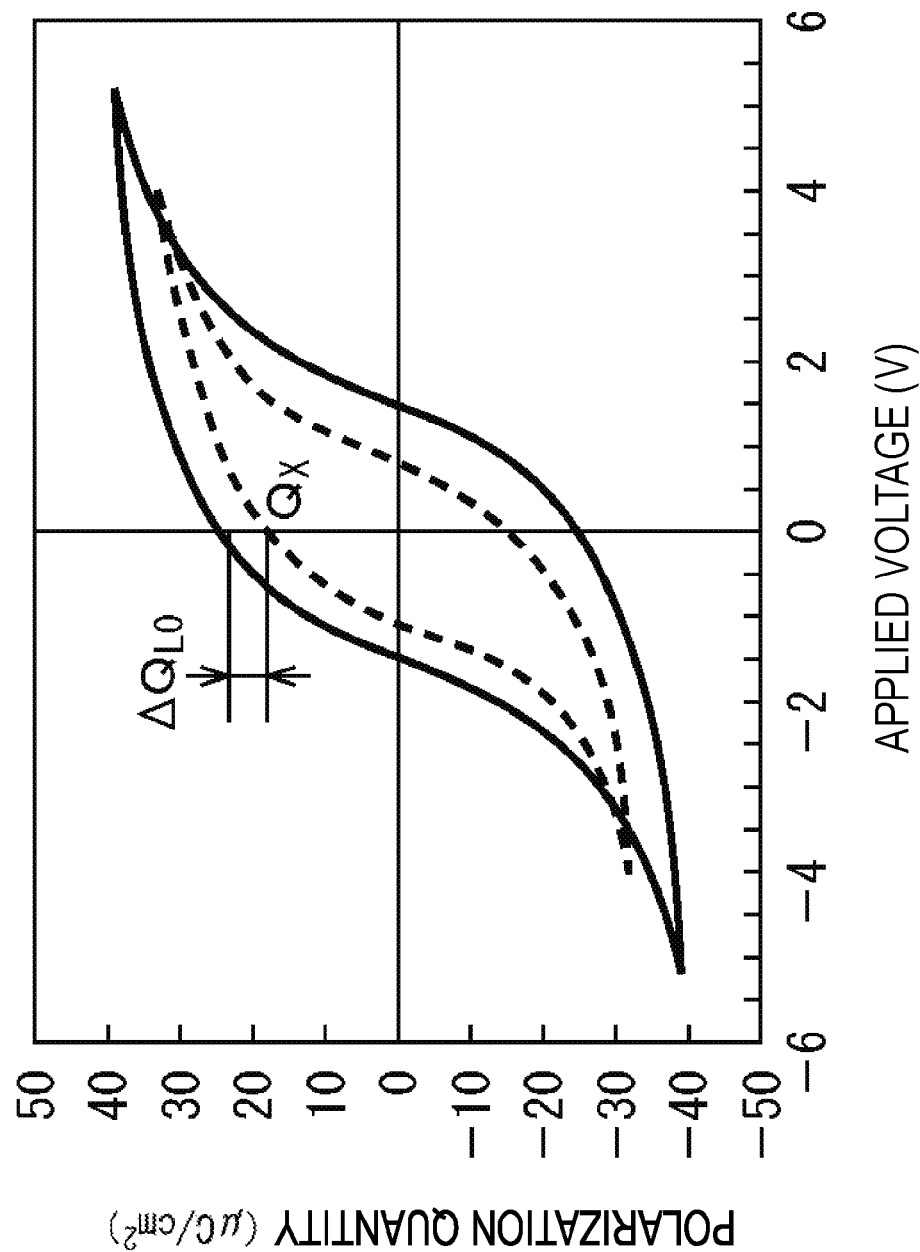
FIG. 6A is a graph showing the difference in residual polarization quantities of a ferroelectric capacitor judged to be acceptable.
Figure 6B:
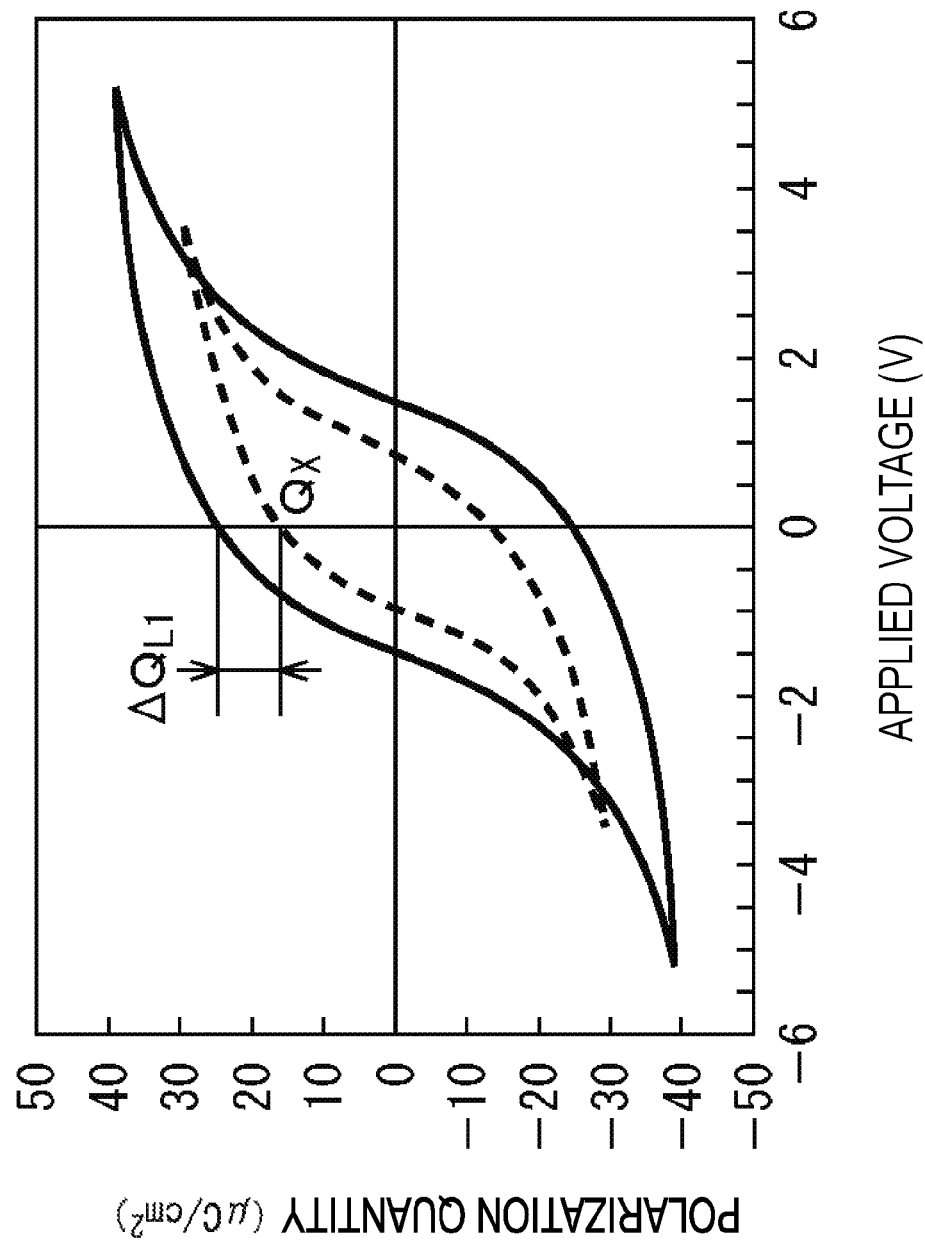
FIG. 6B is a graph showing the difference in residual polarization quantities of a ferroelectric capacitor judged to be defective.

Fourthly, even at a room temperature, concerning the residual polarization quantity Qx when a voltage lower than a predetermined operating voltage is applied, the difference ΔQL0 between the residual polarization quantity in the case where a predetermined operating voltage is applied and the residual polarization quantity Qx in a ferroelectric capacitor judged as acceptable tends to be smaller than the difference ΔQL1 in a ferroelectric capacitor judged as defective. FIG. 6A is a graph showing the difference in residual polarization quantities of a ferroelectric capacitor judged to be acceptable; and FIG. 6B is a graph showing the difference in residual polarization quantities of a ferroelectric capacitor judged to be defective. Solid lines in FIGS. 6A and 6B show the hysteresis loop when a voltage of 5 V is applied; broken lines show the hysteresis loop when a voltage of 3.3 V is applied. As shown in FIGS. 6A and 6B, differences in residual polarization quantities are large if the ferroelectric capacitor is judged as defective. Therefore, it is said that if the threshold value to distinguish between acceptable and defective is set in the rate of the residual polarization quantity to the residual polarization quantity when a predetermined operating voltage is applied (rate of change), by comparing with the threshold value, the test can be conducted without applying thermal load.

In the following embodiments, these tendencies (natural phenomena) are utilized.

First Embodiment

Figure 7:
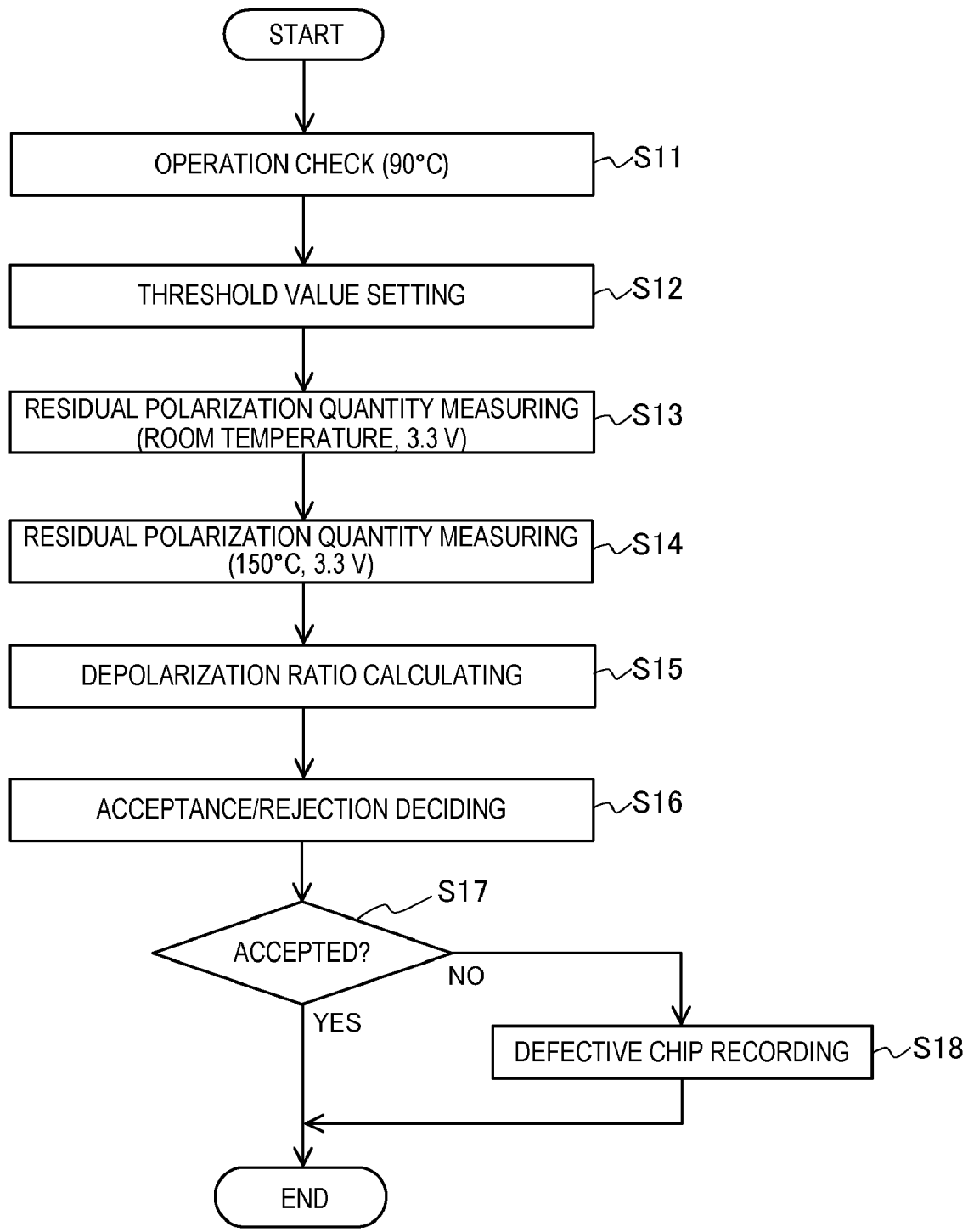
FIG. 7 is a flow chart showing a method for manufacturing a semiconductor device comprising a ferroelectric capacitor according to the first embodiment.

Next, the first embodiment of the present invention will be described. In the first embodiment, tendencies shown in FIGS. 3A and 3B are utilized. FIG. 7 is a flow chart showing a method for manufacturing a semiconductor device comprising a ferroelectric capacitor according to the first embodiment of the present invention.

In the first embodiment, first before wafer dicing, an operation check is conducted at about 90° C. (Step S11). In the operation check, operations against the variation of source voltages, the variation of operation timings or the like are checked.

Next, as a threshold value for distinguishing between products to be accepted and products to be rejected, the previously obtained depolarization ratio of the residual polarization quantity is set (Step S12).

Thereafter, the residual polarization quantity QSW0 of a part of memory cells is measured at a room temperature for each chip (Step S13). In the measurement, the normal operating voltage of the ferroelectric memory, for example, 3.3 V is applied.

Next, the residual polarization quantity QSW1 of the memory cell whose residual polarization quantity QSW0 has been measured in Step S13 is measured at 150° C. (Step S14). In the measurement, the normal operating voltage of the ferroelectric memory, for example, 3.3 V is also applied.

Next, the depolarization ratio is calculated from the following Formula 1 (Step S15).

$$\text{Depolarization ratio} = \frac{(Q_{SW0} - Q_{SW1})}{Q_{SW0}} \times 100(\%) \quad \text{[Formula 1]}$$

Thereafter, the threshold value set in Step S12 is compared with the depolarization ratio obtained in Step S15, and the products having the depolarization ratio of not more than the threshold value are judged as accepted and other products are judged as rejected (Step S16).

Then, the ferroelectric capacitor judged as defective is recorded as the defective chip (Steps S17 and S18). The defective chip may be directly marked to indicate the defective chip, or the location of the defective chip may be recorded as electronic data.

After conducting such a test, chips are diced from the wafer, and the packaging of respective chips is performed.

According to the first embodiment, even if no thermal load is applied in the state wherein data is written, test results equivalent to the test results when thermal load is applied in the state wherein data is written can be obtained. Therefore, while suppressing deterioration accompanying with the thermal load of the ferroelectric capacitor, highly reliable tests can be conducted.

Difference between the temperature in Step S13 and the temperature in Step S14 is preferably 50° C. or more. This is for producing a sufficient difference in residual polarization quantities. In addition, the temperature in Step S13 and the temperature in Step S14 are preferably 270° C. or lower. This is for suppressing the thermal depolarization of the ferroelectric capacitor.

The threshold value of the depolarization ratio that distinguishes between acceptable products and defective products can be optionally set.

Second Embodiment

Figure 8:
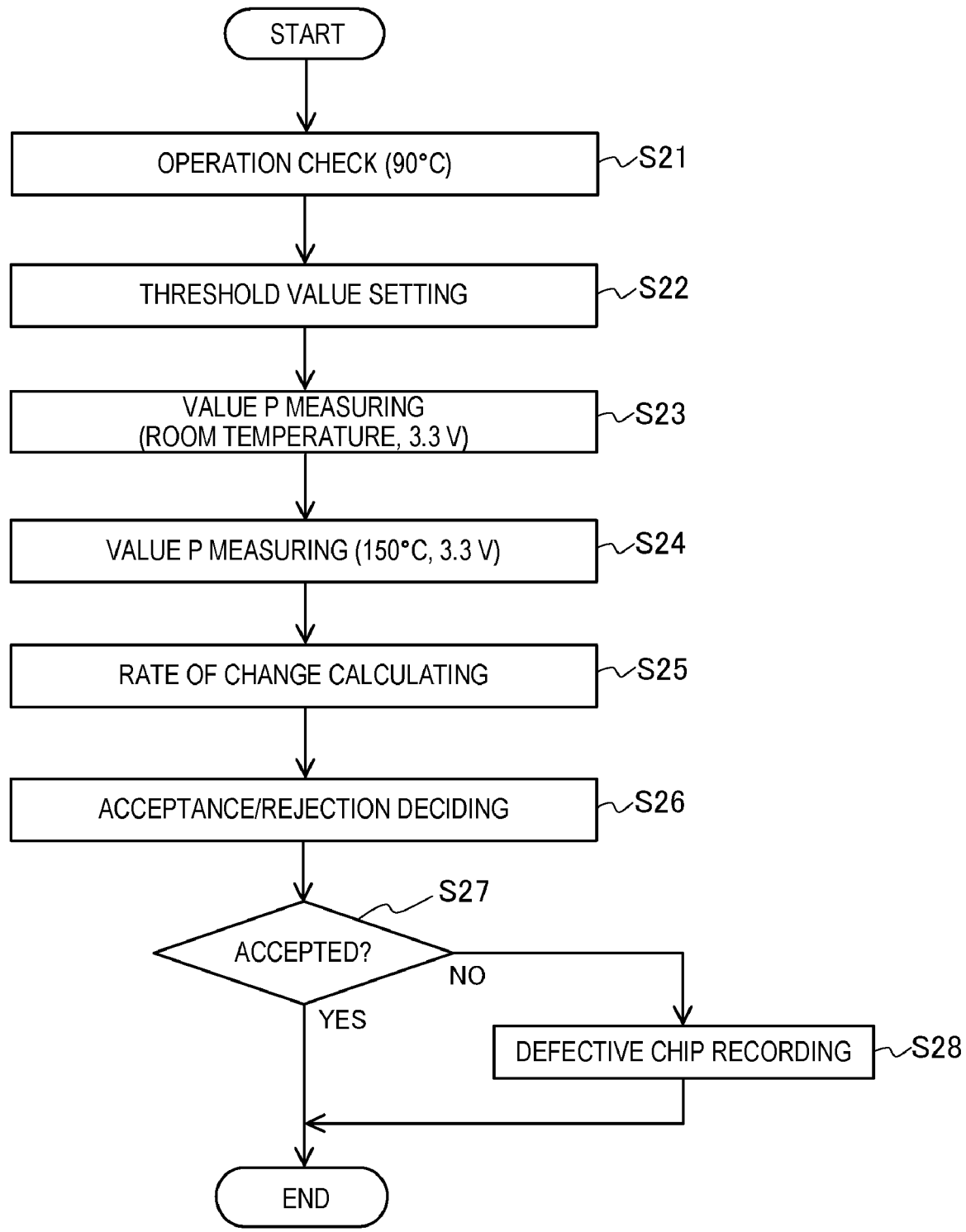
FIG. 8 is a flow chart showing a method for manufacturing a semiconductor device comprising a ferroelectric capacitor according to the second embodiment.

Next, the second embodiment of the present invention will be described. In the second embodiment, tendencies shown in FIGS. 4A and 4B are utilized. FIG. 8 is a flow chart showing a method for manufacturing a semiconductor device comprising a ferroelectric capacitor according to the second embodiment of the present invention.

In the second embodiment, first before wafer dicing, an operation check is conducted at about 90° C. (Step S21). In the operation check, operations against the variation of source voltages, the variation of operation timings or the like are checked.

Next, as a threshold value for distinguishing between products to be accepted and products to be rejected, the previously obtained rate of change of the value P is set (Step S22).

Thereafter, the value P0 of a part of memory cells is measured at a room temperature for each chip (Step S23). In the measurement, the normal operating voltage of the ferroelectric memory, for example, 3.3 V is applied.

Next, the value P1 of the memory cell whose value P0 has been measured in Step S23 is measured at 150° C. (Step S24). In the measurement, the normal operating voltage of the ferroelectric memory, for example, 3.3 V is also applied.

Next, the rate of change in the value P is calculated from the following Formula 2 (Step S25).

$$\text{Rate of change} = \frac{(P_0 - P_1)}{P_0} \times 100 (\%) \qquad \text{[Formula 2]}$$

Thereafter, the threshold value set in Step S22 is compared with the rate of change obtained in Step S25, and the products having the depolarization ratio of not more than the threshold value are judged as accepted and other products are judged as rejected (Step S26).

Then, the ferroelectric capacitor judged as defective is recorded as the defective chip (Steps S27 and S28). The defective chip may be directly marked to indicate the defective chip, or the location of the defective chip may be recorded as electronic data.

After conducting such a test, chips are diced from the wafer, and the packaging of respective chips is performed.

Also according to the second embodiment, even if no thermal load is applied in the state wherein data is written, test results equivalent to the test results when thermal load is applied in the state wherein data is written can be obtained. Therefore, while suppressing deterioration accompanying with the thermal load of the ferroelectric capacitor, highly reliable tests can be conducted.

The threshold value for the rate of change of the value P that distinguishes between acceptable products and defective products can be optionally set.

Third Embodiment

Figure 9:
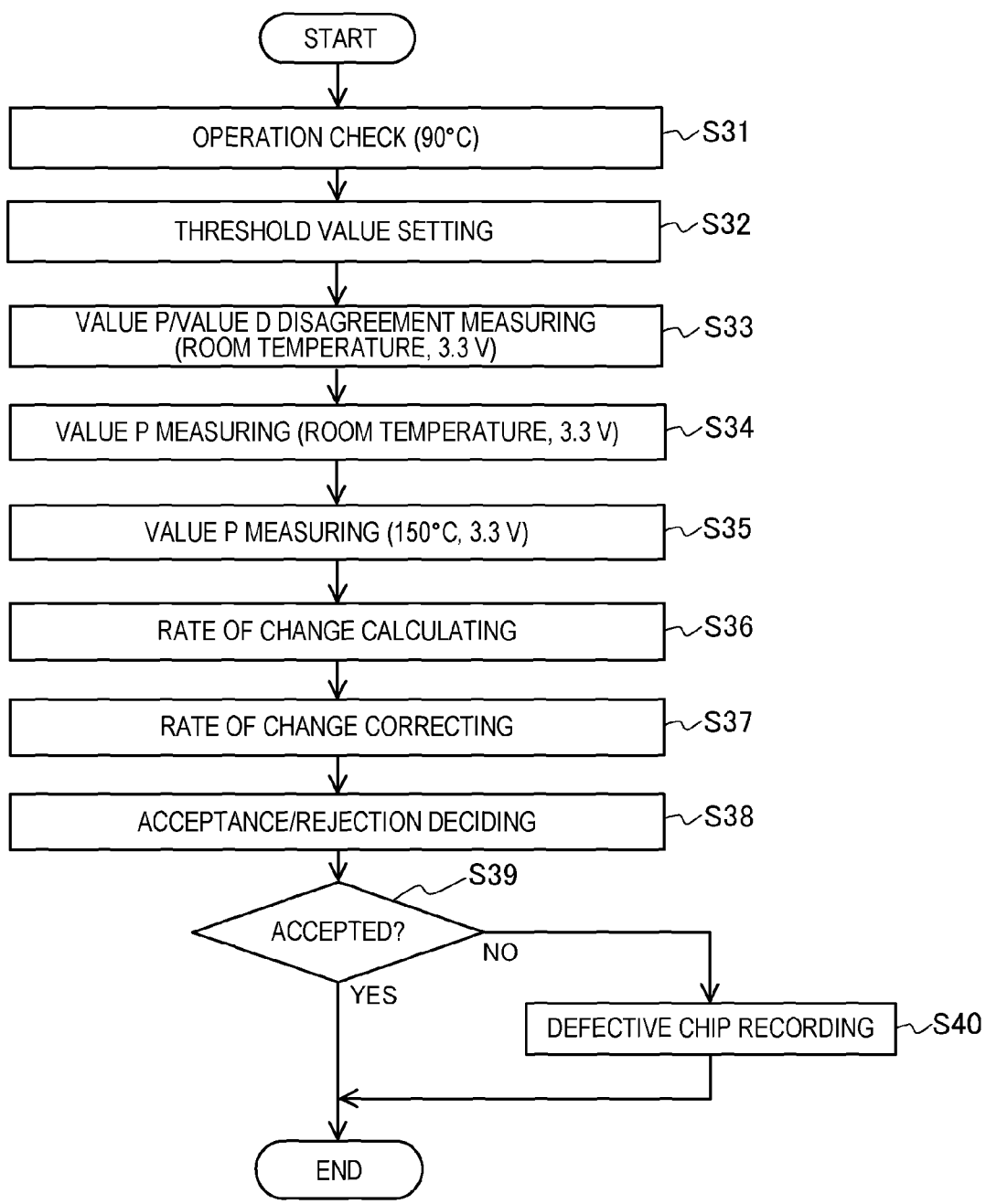
FIG. 9 is a flow chart showing a method for manufacturing a semiconductor device comprising a ferroelectric capacitor according to the third embodiment.

Next, the third embodiment of the present invention will be described. Even in an acceptable ferroelectric capacitor, the hysteresis loop is not always perfectly symmetric. In the second embodiment, if the hysteresis loop is not perfectly symmetric, the chip may be judged as defective even if the chip is equipped with an acceptable ferroelectric capacitor. The third embodiment aims to suppress such an erroneous decision. FIG. 9 is a flow chart showing a method for manufacturing a semiconductor device comprising a ferroelectric capacitor according to the third embodiment of the present invention.

In the third embodiment, first before wafer dicing, an operation check is conducted at about 90° C. (Step S31). In the operation check, operations against the variation of source voltages, the variation of operation timings or the like are checked.

Next, as a threshold value for distinguishing between products to be accepted and products to be rejected, the previously obtained rate of change of the value P is set (Step S32).

Thereafter, the disagreements between the value P and the value D are measured (Step S33). In the measurement, the normal operating voltage of the ferroelectric memory, for example, 3.3 V is applied. The disagreement indicates the symmetry of the hysteresis loop. When the hysteresis loop is perfectly symmetric, the disagreement becomes 0. Here, symmetry means point symmetry that makes the point where the applied voltage and the polarization quantity are 0; and the symmetrical property means the degree of similarity to the above-described point symmetry of the hysteresis loop.

Thereafter, the value P0 of a part of memory cells is measured at a room temperature for each chip (Step S34). In the measurement, the normal operating voltage of the ferroelectric memory, for example, 3.3 V is applied.

Next, the value P1 of the memory cell whose value P0 has been measured in Step S34 is measured at 150° C. (Step S35). In the measurement, the normal operating voltage of the ferroelectric memory, for example, 3.3 V is also applied.

Next, the rate of change in the value P is calculated from the following Formula 2 (Step S36).

Next, using the disagreement obtained in Step S33, the rate of change obtained in Step S36 is corrected (Step S37). Specifically, the rate of change obtained in Step S36 is corrected to the value obtained when the hysteresis loop is perfectly symmetric.

Thereafter, the threshold value set in Step S32 is compared with the rate of change corrected in Step S37, and the products having the rate of change of not more than the threshold value are judged as accepted and other products are judged as rejected (Step S38).

Then, the ferroelectric capacitor judged as defective is recorded as the defective chip (Steps S39 and S40). The defective chip may be marked to indicate the defective chip, or the location of the defective chip may be recorded as electronic data.

After conducting such a test, chips are diced from the wafer, and the packaging of respective chips is performed.

According to the third embodiment, the more reliable test can be conducted comparing with the second embodiment.

Fourth Embodiment

Figure 10:
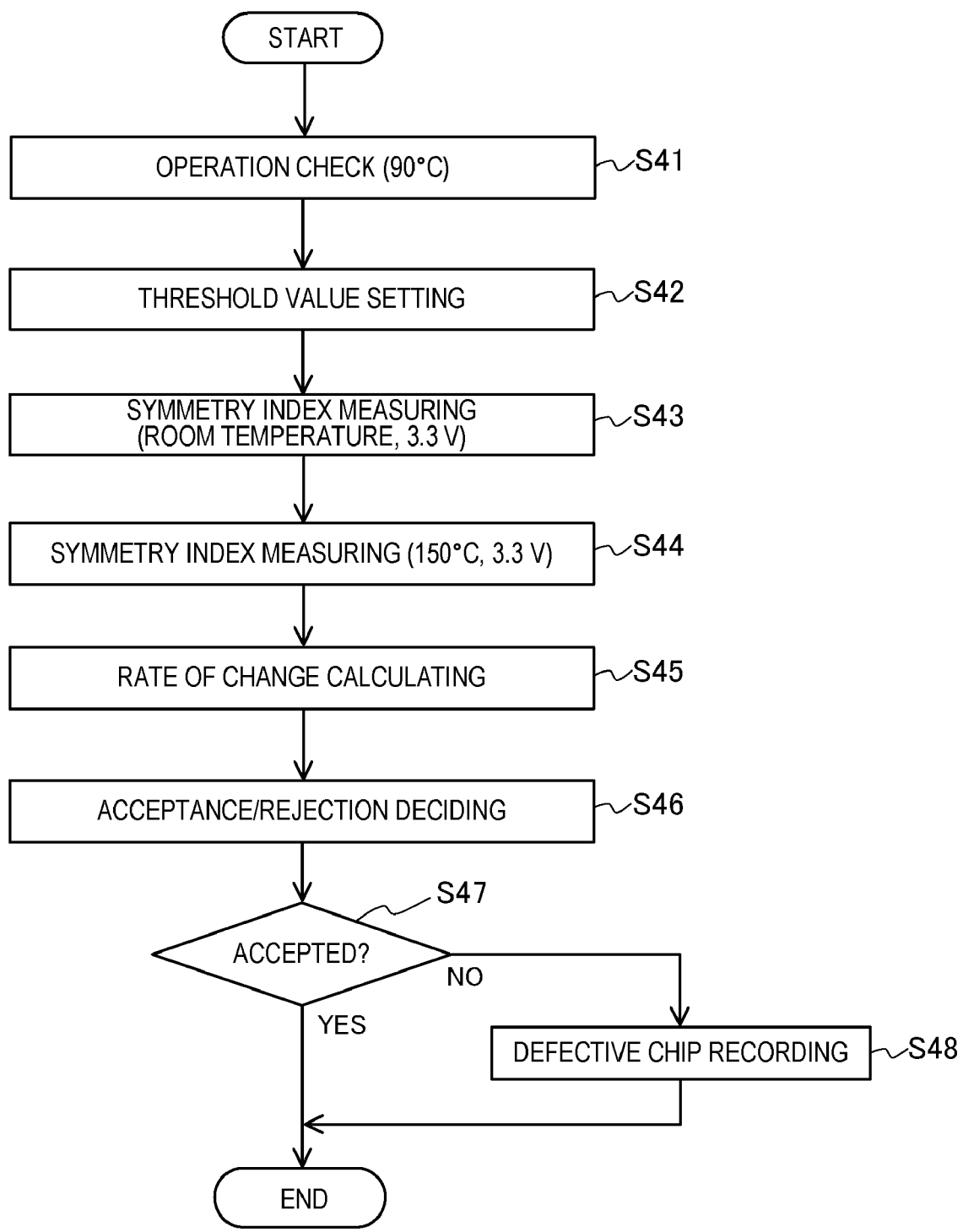
FIG. 10 is a flow chart showing a method for manufacturing a semiconductor device comprising a ferroelectric capacitor according to the fourth embodiment.

Next, the fourth embodiment of the present invention will be described. In the fourth embodiment, tendencies shown in FIGS. 5A and 5B are utilized. FIG. 10 is a flow chart showing a method for manufacturing a semiconductor device comprising a ferroelectric capacitor according to the fourth embodiment of the present invention.

In the fourth embodiment, first before wafer dicing, an operation check is conducted at about 90° C. (Step S41). In the operation check, operations against the variation of source voltages, the variation of operation timings or the like are checked.

Next, as a threshold value for distinguishing between products to be accepted and products to be rejected, the previously obtained rate of change of the symmetry index is set (Step S42). As the symmetry index, the value indicating the sym metry of the hysteresis loop is used. For example, the value obtained from the following Formula 3 can be used.

$$\text{Symmetry index} = \frac{|N - U| - |P - D|}{2}$$ [Formula 3]

Thereafter, the symmetry index S0 of a part of memory cells is measured at a room temperature for each chip (Step S43). In the measurement, the normal operating voltage of the ferroelectric memory, for example, 3.3 V is applied.

Next, the symmetry index S1 of the memory cell whose symmetry index S0 has been measured in Step S43 is measured at 150° C. (Step S44). In the measurement, the normal operating voltage of the ferroelectric memory, for example, 3.3 V is also applied.

Next, the rate of change in the symmetry index is calculated from the following Formula 4 (Step S45).

$$\text{Rate of change} = \frac{(I_0 - I_1)}{I_0} \times 100(\%)$$ [Formula 4]

Thereafter, the threshold value set in Step S42 is compared with the rate of change obtained in Step S45, and the products having the rate of change not more than the threshold value are judged as accepted and other products are judged as rejected (Step S46).

Then, the ferroelectric capacitor judged as defective is recorded as the defective chip (Steps S47 and S48). The defective chip may be marked to indicate the defective chip, or the location of the defective chip may be recorded as electronic data.

After conducting such a test, chips are diced from the wafer, and the packaging of respective chips is performed.

Also according to the fourth embodiment, even if no a thermal load is applied in the state wherein data is written, test results equivalent to the test results when thermal load is applied in the state wherein data is written can be obtained. Therefore, while suppressing deterioration accompanying with the thermal load of the ferroelectric capacitor, a highly reliable test can be conducted.

The threshold value for the rate of change of the symmetry index that distinguishes between acceptable products and defective products can be optionally set.

Fifth Embodiment

Figure 11:
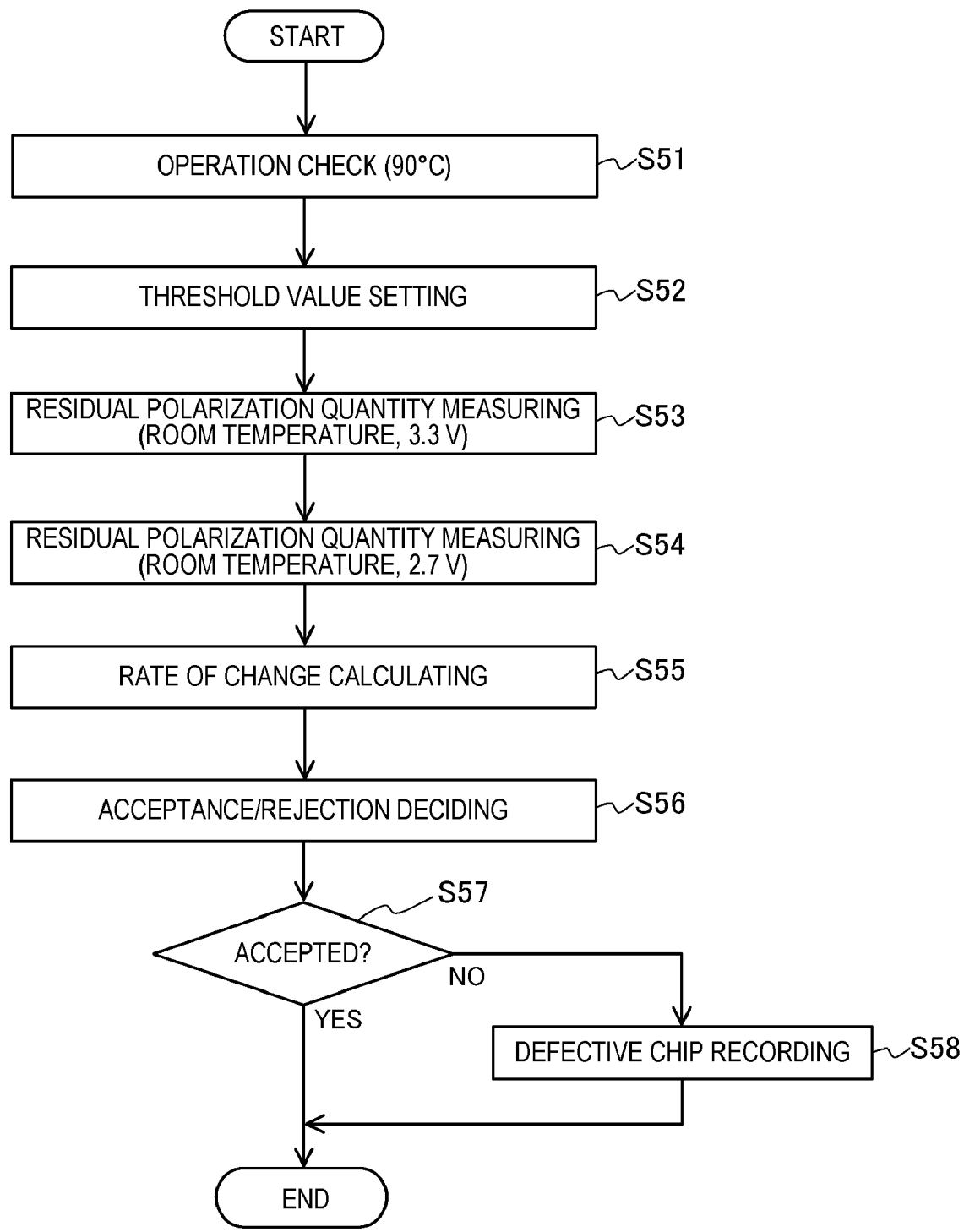
FIG. 11 is a flow chart showing a method for manufacturing a semiconductor device comprising a ferroelectric capacitor according to the fifth embodiment.

Next, the fifth embodiment of the present invention will be described. In the fifth embodiment, tendencies shown in FIGS. 6A and 6B are utilized. FIG. 11 is a flow chart showing a method for manufacturing a semiconductor device comprising a ferroelectric capacitor according to the fifth embodiment of the present invention.

In the fifth embodiment, first before wafer dicing, an operation check is conducted at about 90° C. (Step S51). In the operation check, operations against the variation of source voltages, the variation of operation timings or the like are checked.

Next, as a threshold value for distinguishing between products to be accepted and products to be rejected, the previously obtained rate of change of difference in the residual polarization quantities is set (Step S52).

Thereafter, the residual polarization quantity QL0 of a part of the memory cells is measured at a room temperature for each chip (Step S53). In the measurement, the normal operating voltage of the ferroelectric memory, for example, 3.3 V is applied.

Next, the residual polarization quantity QL1 of the memory cell whose residual polarization quantity QL0 has been measured in Step S53 is measured at a room temperature (Step S54). In the measurement, a voltage lower than the normal operating voltage of the ferroelectric memory, for example, 2.7 V is used as the maximum applied voltage.

Next, the rate of change in the residual polarization quantity is calculated from the following Formula 5 (Step S55).

$$\text{Rate of change} = \frac{(Q_{L0} - Q_{L1})}{Q_{L0}} \times 100(\%)$$ [Formula 5]

Thereafter, the threshold value set in Step S52 is compared with the rate of change obtained in Step S55, and the products having the rate of change in the residual polarization quantity of not more than the threshold value are judged as accepted and other products are judged as rejected (Step S56).

Then, the ferroelectric capacitor judged as defective is recorded as the defective chip (Steps S57 and S58). The defective chip may be marked to indicate the defective chip, or the location of the defective chip may be recorded as electronic data.

After conducting such a test, chips are diced from the wafer, and the packaging of respective chips is performed.

Also according to the fifth embodiment, even if no thermal load is applied in the state wherein data is written, test results equivalent to the test results when thermal load is applied in the state wherein data is written can be obtained. Therefore, while suppressing deterioration occurring with the thermal load of the ferroelectric capacitor, highly reliable test can be conducted.

The difference between the maximum applied voltage in Step S53 and the maximum applied voltage in Step S54 is preferably not less than 10% of the rated voltage of the ferroelectric capacitor. This is to produce a sufficient difference in residual polarization quantities. The maximum applied voltage in Step S53 and the maximum applied voltage in Step S54 are preferably not less than 70% of the rated voltage of the ferroelectric capacitor. Otherwise, misjudgment would more easily occur. For example, when the operation warranty range of a ferroelectric capacitor is 3.0 V to 3.6 V and the rated voltage of the ferroelectric capacitor is 3.3 V, the difference in the maximum applied voltages is preferably 0.33 V or more, and the both maximum applied voltages are preferably 2.31 V or more.

The threshold value for the rate of change of the residual polarization quantity that distinguishes between acceptable products and defective products can be optionally set.

Sixth Embodiment

Figure 12:
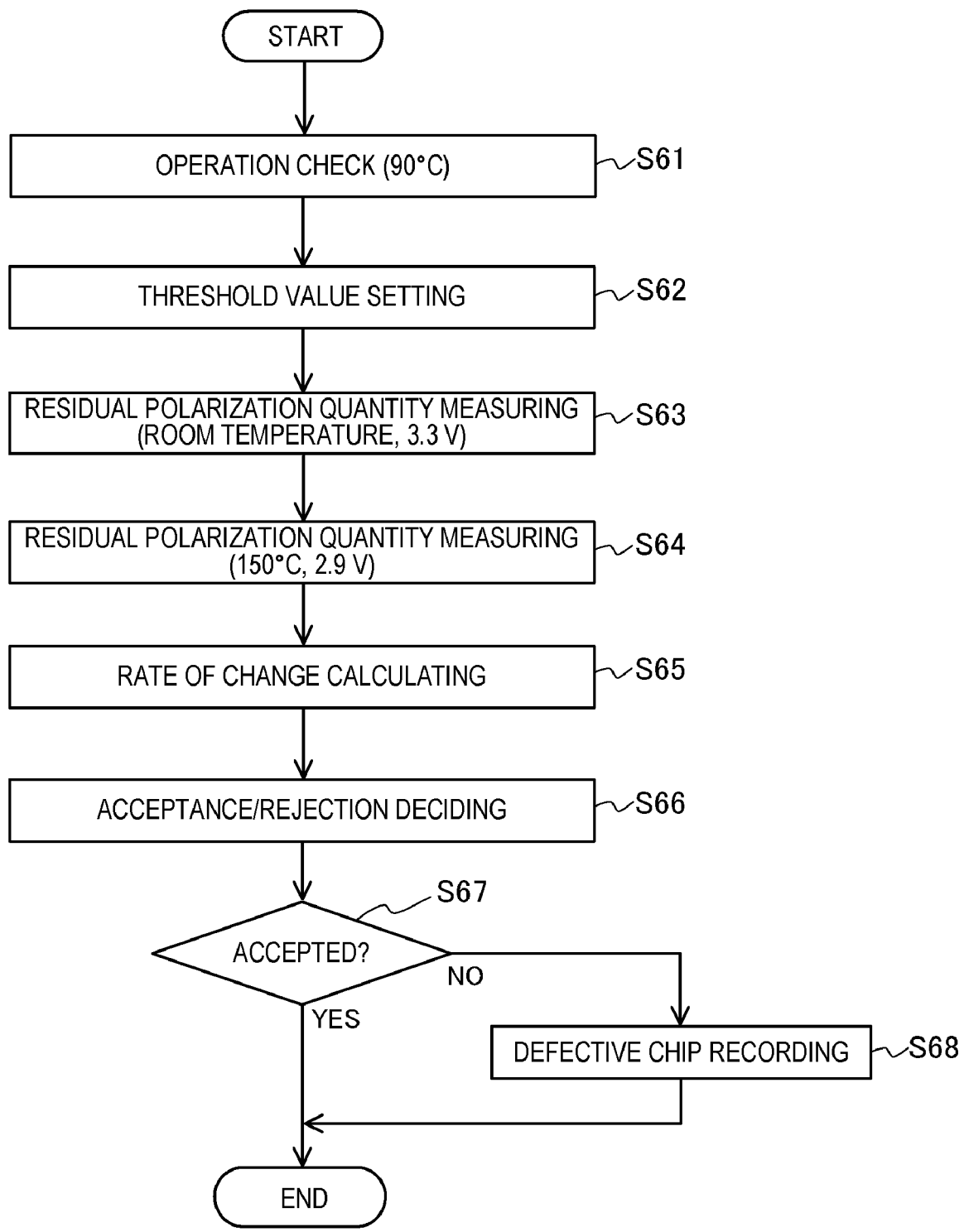
FIG. 12 is a flow chart showing a method for manufacturing a semiconductor device comprising a ferroelectric capacitor according to the sixth embodiment.

Next, the sixth embodiment of the present invention will be described. In the fifth embodiment, since the temperature when a low voltage is applied is a room temperature, change in hysteresis is not always sufficient. The sixth embodiment aims to make the change in the hysteresis loop sufficient, the first embodiment is combined with the fifth embodiment. FIG. 12 is a flow chart showing a method for manufacturing a semiconductor device comprising a ferroelectric capacitor according to the sixth embodiment of the present invention.

In the sixth embodiment, first before wafer dicing, an operation check is conducted at about 90° C. (Step S61). In the operation check, operations against the variation of source voltages, the variation of operation timings or the like are checked.

Next, as a threshold value for distinguishing between products to be accepted and products to be rejected, the previously obtained rate of change of difference in the residual polarization quantities is set (Step S62).

Thereafter, the residual polarization quantity QL0 of a part of memory cells is measured at a room temperature for each chip (Step S63). In the measurement, the normal operating voltage of the ferroelectric memory, for example, 3.3 V is applied.

Next, the residual polarization quantity QL1 of the memory cell whose residual polarization quantity QL0 has been measured in Step S63 is measured at 150° C. (Step S64). In the measurement, a voltage lower than the normal operating voltage of the ferroelectric memory, for example, 2.9 V is used as the maximum applied voltage.

Next, the rate of change in the residual polarization quantity is calculated from the following Formula 5 (Step S65).

$$\text{Rate of change} = \frac{(Q_{L0} - Q_{L1})}{Q_{L0}} \times 100(\%) \quad \text{[Formula 5]}$$

Thereafter, the threshold value set in Step S62 is compared with the rate of change obtained in Step S65, and the products having the rate of change in the residual polarization quantity of not more than the threshold value are judged as accepted and other products are judged as rejected (Step S66).

Then, the ferroelectric capacitor judged as defective is recorded as the defective chip (Steps S67 and S68). The defective chip may be marked to indicate the defective chip, or the location of the defective chip may be recorded as electronic data.

After conducting such a test, chips are diced from the wafer, and the packaging of respective chips is performed.

Also according to the sixth embodiment, even if no thermal load is applied in the state wherein data is written, test results equivalent to the test results when thermal load is applied in the state wherein data is written can be obtained. Therefore, while suppressing deterioration accompanying with the thermal load of the ferroelectric capacitor, highly reliable tests can be conducted.

The threshold value for the rate of change of the residual polarization quantity that distinguishes between acceptable products and defective products can be optionally set.

Seventh Embodiment

Figure 13:
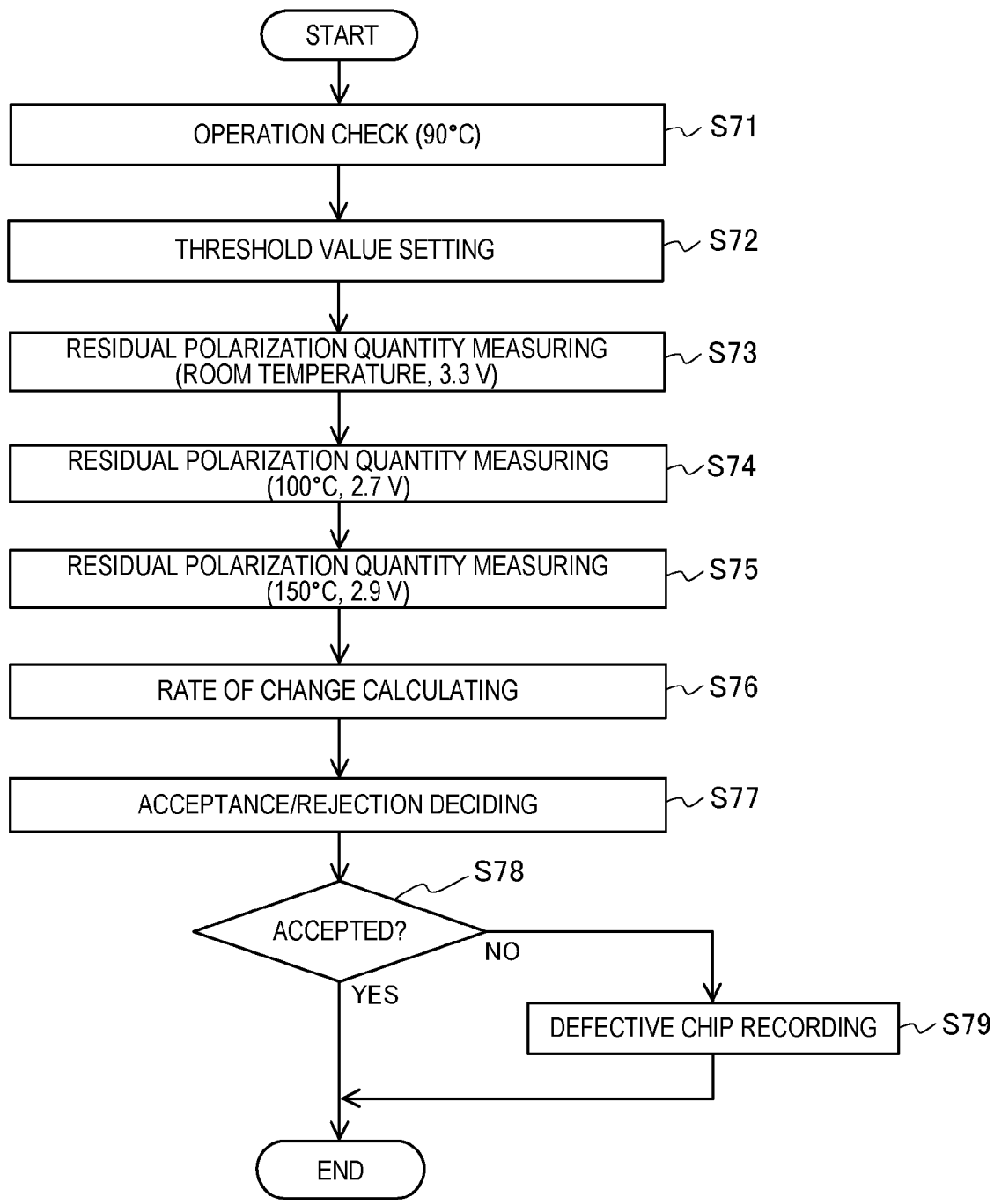
FIG. 13 is a flow chart showing a method for manufacturing a semiconductor device comprising a ferroelectric capacitor according to the seventh embodiment.

Next, the seventh embodiment of the present invention will be described. The seventh embodiment aims to further improve the reliability of the sixth embodiment. FIG. 13 is a flow chart showing a method for manufacturing a semiconductor device comprising a ferroelectric capacitor according to the seventh embodiment of the present invention.

In the seventh embodiment, first before wafer dicing, an operation check is conducted at about 90° C. (Step S71). In the operation check, operations against the variation of source voltages, the variation of operation timings or the like are checked.

Next, as a threshold value for distinguishing between products to be accepted and products to be rejected, the previously obtained rate of change of difference in the residual polarization quantities is set (Step S72). In the seventh embodiment, two kinds of the rates of change are set.

Thereafter, the residual polarization quantity QL0 of a part of memory cells is measured at a room temperature for each chip (Step S73). In the measurement, the normal operating voltage of the ferroelectric memory, for example, 3.3 V is applied.

Next, the residual polarization quantity QL1 of the memory cell whose residual polarization quantity QL0 has been measured in Step S73 is measured at 100° C. (Step S74). In the measurement, a voltage lower than the normal operating voltage of the ferroelectric memory, for example, 2.7 V is used as the maximum applied voltage.

Next, the residual polarization quantity QL2 of the memory cell whose residual polarization quantity QL0 has been measured in Step S73 is measured at 150° C. (Step S75). In the measurement, a voltage lower than the normal operating voltage of the ferroelectric memory, and higher than the voltage applied in Step S74, for example, 2.9 V is used as the maximum applied voltage.

Thereafter, the first rate of change in the residual polarization quantity is calculated from the following Formula 5, and the second rate of change in the residual polarization quantity is calculated from the following Formula 6 (Step S76).

$$\text{Rate of change} = \frac{(Q_{L0} - Q_{L2})}{Q_{L0}} \times 100(\%) \quad \text{[Formula 6]}$$

Thereafter, two kinds of threshold values set in Step S62 are compared with the two kinds of rates of change obtained in Steps S75 and S76, and the products having the rate of change in the residual polarization quantity of not more than the threshold value are judged as accepted and other products are judged as rejected (Step S77).

Then, the ferroelectric capacitor judged as defective is recorded as the defective chip (Steps S78 and S79). The defective chip may be marked to indicate the defective chip, or the location of the defective chip may be recorded as electronic data.

After conducting such a test, chips are diced from the wafer, and the packaging of respective chips is performed.

According to the seventh embodiment, a more reliable test can be conducted by comparing it with the sixth embodiment.

In these embodiments, although the residual polarization quantities and the like are measured only for a part of memory cells in respective chips, if the time constraint is loose, all the memory cells may be measured. Also in respective embodiments, the order of acquiring characteristic values, such as residual polarization quantities, is not limited, but either acquirement at a high voltage or acquirement at a low voltage may be performed before the other. Also in embodiments other than the third embodiment, the characteristic value or the like obtained from the residual polarization quantity may be corrected in the same manner as in the third embodiment. If the effect to the characteristics of the ferroelectric capacitor is slight, some degree of thermal load may be applied.

RESULTS OF EXPERIMENT

Next, an experiment actually conducted by the present inventors will be described. In this experiment, a plurality of wafers in the same lot were tested using the method according to a conventional method or the first embodiment. Although the same wafer was not tested using the two methods, since wafers in the same lot were used, it is considered that there would have been no large difference in results if the same degree of reliability tests were conducted. The results of experiment are shown in FIG. 14.

Figure 14:
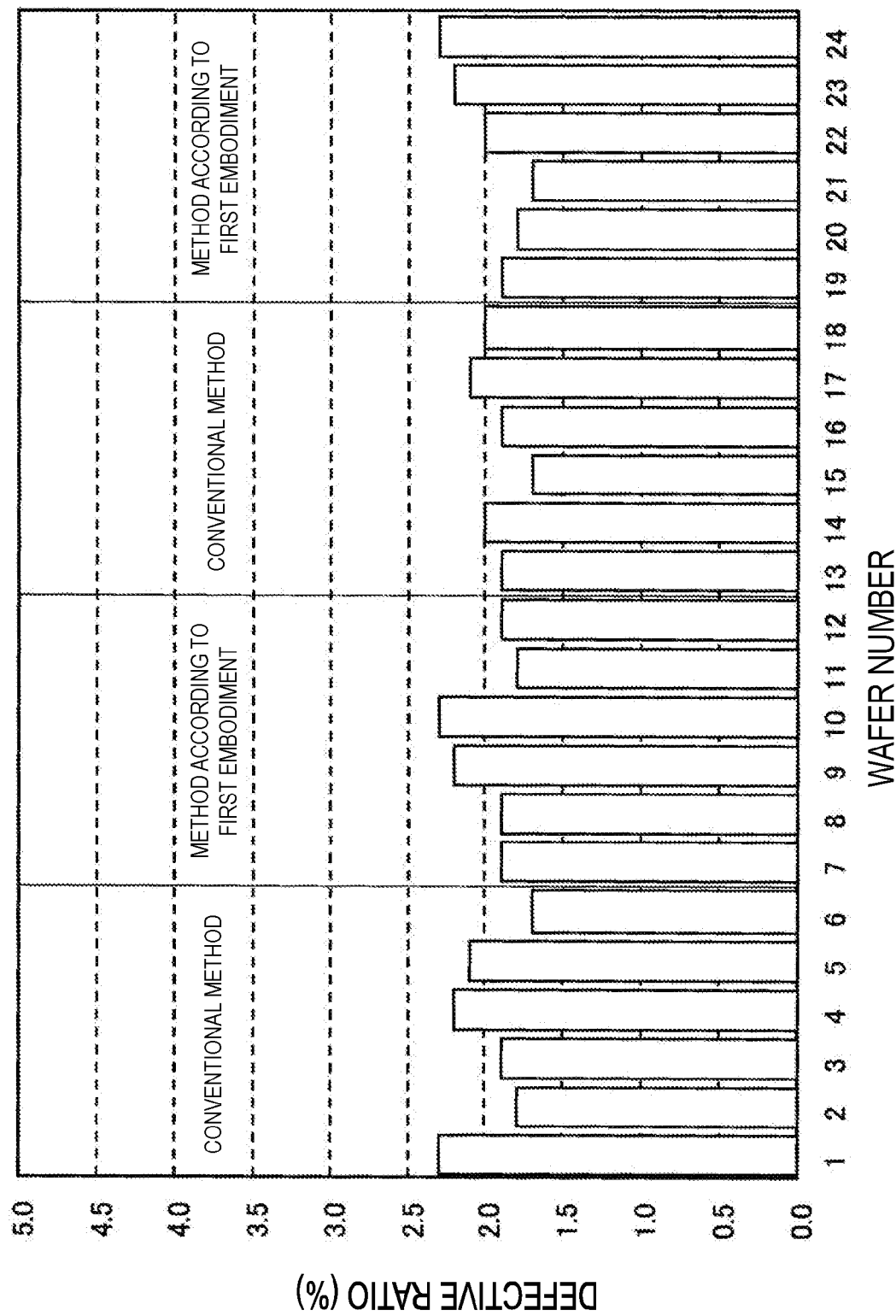
FIG. 14 is a graph showing the results of the experiment.

As shown in FIG. 14, when the results of the conventional method were compared with the results of the method according to the first embodiment, the same degree of results were obtained. This means that the same degree of reliability test could be conducted by the first embodiment as the conventional method.

When accelerated tests were conducted after the above-described tests, the same degree of results could be obtained by the method according to the first embodiment as the conventional method. It is considered from these results, that sufficient tests could be conducted. This is because if sufficient tests could not be conducted by the method according to the first embodiment, the increased defect ratio would be observed by the accelerated tests.

What is claimed is:

1. A method for manufacturing a semiconductor device equipped with a ferroelectric capacitor comprising:
   acquiring a characteristic value obtained from a hysteresis loop that indicates a relationship between an applied voltage and a polarization quantity of the ferroelectric capacitor at a first temperature;
   acquiring the characteristic value at a second temperature different from the first temperature; and
   conducting an acceptance/rejection judgment about the semiconductor device on a basis of a difference between the characteristic value acquired at the first temperature and the characteristic value acquired at the second temperature.

2. The method for manufacturing a semiconductor device according to claim 1, wherein
   a difference between the first temperature and the second temperature is greater than or equal to 50° C.

3. The method for manufacturing a semiconductor device according to claim 1, wherein
   the first temperature and the second temperature are each less than or equal to 270° C.

4. The method for manufacturing a semiconductor device according to claim 1, wherein
   a digitalized difference is compared with a previously determined threshold value in conducting the acceptance/rejection judgment.

5. The method for manufacturing a semiconductor device according to claim 4, wherein
   before conducting the acceptance/rejection judgment, a symmetry of the hysteresis loop is acquired at the lower temperature with respect to the first temperature and the second temperature, and
   the digitalized difference is corrected on a basis of the symmetry in conducting the acceptance/rejection judgment.

6. The method for manufacturing a semiconductor device according to claim 1, wherein
   the characteristic value is a residual polarization quantity.

7. The method for manufacturing a semiconductor device according to claim 1, wherein
   the characteristic value is a difference between a residual polarization quantity and a saturated polarization quantity.

8. The method for manufacturing a semiconductor device according to claim 7, wherein
   a sign of the residual polarization quantity is different from a sign of the saturated polarization quantity.

9. The method for manufacturing a semiconductor device according to claim 7, wherein
   the sign of the residual polarization quantity is the same as the sign of the saturated polarization quantity.

10. The method for manufacturing a semiconductor device according to claim 1, wherein
    the characteristic value is a value that reflects the symmetry of the hysteresis loop.

11. A method for manufacturing a semiconductor device equipped with a ferroelectric capacitor comprising:
    acquiring a characteristic value obtained from a hysteresis loop that indicates a relationship between an applied voltage and a polarization quantity of the ferroelectric capacitor under a condition where a maximum voltage value of the applied value is a first voltage;
    acquiring the characteristic value under a condition where the maximum voltage value of the applied value is a second voltage rather than the first voltage; and
    conducting an acceptance/rejection judgment about the semiconductor device on a basis of a difference between the characteristic value acquired at the first voltage and the characteristic value acquired at the second voltage.

12. The method for manufacturing a semiconductor device according to claim 11, wherein
    a temperature at which the characteristic value is acquired at the first voltage is the same as a temperature at which the characteristic value is acquired at the second voltage.

13. The method for manufacturing a semiconductor device according to claim 11, wherein
    a temperature at which the characteristic value is acquired at the lower voltage of the first voltage and the second voltage is made higher than a temperature at which the characteristic value is acquired at the other voltage.

14. The method for manufacturing a semiconductor device according to claim 11, wherein
    a difference between the first voltage and the second voltage is not less than 10% of a rated voltage of the ferroelectric capacitor.

15. The method for manufacturing a semiconductor device according to claim 11, wherein
    the first voltage and the second voltage are not less than 70% of the rated voltage of the ferroelectric capacitor.

16. The method for manufacturing a semiconductor device according to claim 11, wherein
    the characteristic value is acquired under a condition where the maximum voltage value of the applied voltage is a third voltage rather than the first and second voltages; and
    the acceptance/rejection judgment is conducted about the semiconductor device on a basis of difference between the characteristic value acquired at the first or second voltage and the characteristic value acquired at the third voltage.

17. The method for manufacturing a semiconductor device according to claim 11, wherein
    the characteristic value is a residual polarization quantity.

18. The method for manufacturing a semiconductor device according to claim 11, wherein
    a digitalized difference is compared with a previously determined threshold value in conducting the acceptance/rejection judgment.

19. The method for manufacturing a semiconductor device according to claim 18, wherein
    before conducting the acceptance/rejection judgment, a symmetry of the hysteresis loop is acquired at the lower temperature in the first temperature and the second temperature, and
    the digitalized difference is corrected on the basis of the symmetry in conducting the acceptance/rejection judgment.

* * * * *